(12) United States Patent
Rabkin et al.

(10) Patent No.: US 9,780,108 B2
(45) Date of Patent: Oct. 3, 2017

(54) ULTRATHIN SEMICONDUCTOR CHANNEL THREE-DIMENSIONAL MEMORY DEVICES

(71) Applicant: SANDISK TECHNOLOGIES INC., Plano, TX (US)

(72) Inventors: Peter Rabkin, Cupertino, CA (US); Jayavel Pachamuthu, San Jose, CA (US); Masaaki Higashitani, Cupertino, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/886,507

(22) Filed: Oct. 19, 2015

(65) Prior Publication Data

US 2017/0110464 A1 Apr. 20, 2017

(51) Int. Cl.
*H01L 29/792* (2006.01)
*H01L 27/1157* (2017.01)
*H01L 27/11582* (2017.01)
*H01L 29/10* (2006.01)
*H01L 29/32* (2006.01)

(52) U.S. Cl.
CPC .... *H01L 27/1157* (2013.01); *H01L 27/11582* (2013.01); *H01L 29/1033* (2013.01); *H01L 29/32* (2013.01)

(58) Field of Classification Search
None
See application file for complete search history.

(56) References Cited

U.S. PATENT DOCUMENTS

| | | | |
|---|---|---|---|
| 5,915,167 | A | 6/1999 | Leedy |
| 6,274,490 | B1 | 8/2001 | Chyan et al. |
| 6,677,213 | B1 | 1/2004 | Ramkumar et al. |
| 6,777,274 | B2 | 8/2004 | Moon et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Michael Lebentritt
*Assistant Examiner* — Jordan Klein
(74) *Attorney, Agent, or Firm* — The Marbury Law Group PLLC

(57) ABSTRACT

An alternating stack of insulating layers and sacrificial material layers is formed over a substrate. Memory openings are formed through the alternating stack to the substrate. After formation of memory film layers, a sacrificial cover material layer can be employed to protect the tunneling dielectric layer during formation of a bottom opening in the memory film layers. An amorphous semiconductor material layer can be deposited and optionally annealed in an ambient including argon and/or deuterium to form a semiconductor channel layer having a thickness less than 5 nm and surface roughness less than 10% of the thickness. Alternately or additionally, at least one interfacial layer can be employed on either side of the amorphous semiconductor material layer to reduce surface roughness of the semiconductor channel. The ultrathin channel can have enhanced mobility due to quantum confinement effects.

33 Claims, 27 Drawing Sheets

(56) References Cited

U.S. PATENT DOCUMENTS

| | | | |
|---|---|---|---|
| 6,833,306 B2 | 12/2004 | Lyding et al. | |
| 6,881,994 B2 | 4/2005 | Lee et al. | |
| 7,005,350 B2 | 2/2006 | Walker et al. | |
| 7,012,299 B2 | 3/2006 | Mahajani et al. | |
| 7,202,119 B2 | 4/2007 | Yamazaki et al. | |
| 8,829,593 B2 * | 9/2014 | Sekine et al. | H01L 27/11551 257/324 |
| 9,425,299 B1 * | 8/2016 | Rabkin et al. | H01L 29/7783 |
| 9,431,417 B1 * | 8/2016 | Lai et al. | H01L 27/11582 |
| 2003/0047755 A1 | 3/2003 | Lee et al. | |
| 2003/0122204 A1 | 7/2003 | Nomoto et al. | |
| 2003/0155582 A1 | 8/2003 | Mahajani et al. | |
| 2003/0219933 A1 * | 11/2003 | Yamauchi et al. | H01L 29/0634 438/156 |
| 2004/0041192 A1 | 3/2004 | Baker | |
| 2004/0063286 A1 * | 4/2004 | Kim et al. | H01L 21/82341 438/283 |
| 2004/0125629 A1 | 7/2004 | Scheuerlein et al. | |
| 2004/0251488 A1 | 12/2004 | Fujiwara et al. | |
| 2005/0062098 A1 | 3/2005 | Mahajani et al. | |
| 2008/0012065 A1 | 1/2008 | Kumar | |
| 2010/0109071 A1 * | 5/2010 | Tanaka et al. | H01L 27/11582 257/324 |
| 2011/0045657 A1 * | 2/2011 | Kim et al. | H01L 21/321 438/476 |
| 2012/0023894 A1 | 2/2012 | Martin | |
| 2012/0068247 A1 * | 3/2012 | Lee et al. | H01L 27/11551 257/316 |
| 2012/0276702 A1 * | 11/2012 | Yang et al. | H01L 27/11582 438/270 |
| 2013/0009236 A1 * | 1/2013 | Lee et al. | H01L 27/11556 257/329 |
| 2013/0089974 A1 * | 4/2013 | Lee et al. | H01L 27/11556 438/510 |
| 2013/0134492 A1 * | 5/2013 | Yang et al. | H01L 27/11582 257/314 |
| 2014/0225181 A1 * | 8/2014 | Makala et al. | H01L 29/7889 257/321 |
| 2015/0129954 A1 * | 5/2015 | Kim et al. | H01L 29/7926 257/328 |
| 2015/0179660 A1 | 6/2015 | Yada et al. | |
| 2016/0181264 A1 * | 6/2016 | Miyamoto et al. | H01L 27/11524 257/314 |
| 2016/0260732 A1 * | 9/2016 | Lue | H01L 27/11582 |

OTHER PUBLICATIONS

Tung-Shen Chen et al., "Performance Improvement of SONOS Memory by Bandgap Engineering of Charge-Trapping Layer," IEEE Electron Device Letters, vol. 25, No. 4, Apr. 2004, pp. 205-207.

Kuo-Hong Wu et al., "SONOS Device With Tapered Bandgap Nitride Layer," IEEE Transactions on Electron Devices, vol. 52, No. 5, May 2005, pp .987-992.

Kuo-Hong Wu et al., "PhenomenalSONOS Performance for Next-Generation Flash Memories," Semiconductor Lab, Chung-Cheng Institute of Technology, National Defense University, Taiwan and National Nano-Device Lab Taiwan, pp. 35-40.

A.A. Evtukh et al., "The MultilayerSilicon Nitride Films As A Media for Charge Storagein MNOS Structures," IEEE *Xplore* 2.0, Nonvolatile Memory Technology Conference, 1996, Sixth Biennial IEEE International, Jun. 24-26, 1996, Abstract Only.

Johnson, N. M. et al, "Deuterium Passivation of Grain-Boundary Dangling Bonds In Silicon Thin Film", *Applied Physics Letters*, vol. 40, pp. 882-884, (1982).

Choi, S. et al., "High-Pressure Deuterium Annealing for Improving The Reliability Characteristics of SONOS Nonvolatile Memory Devices", *Applied Physics Letters*, vol. 85, pp. 6415-6417, (2004).

Chang, M. et al., "Impact Of High-Pressure Deuterium Oxide Annealing On The Blocking Efficiency and Interface Quality of MANOS-Type Flash Memory Devices", *Applied Physics Letters*, vol. 91, p. 192111, (2007).

U.S. Appl. No. 14/225,116, filed Mar. 25, 2014, SanDisk Technologies Inc.

U.S. Appl. No. 14/225,176, filed Mar. 25, 2014, SanDisk Technologies Inc.

U.S. Appl. No. 14/462,156, filed Aug. 18, 2014, SanDisk Technologies Inc.

U.S. Appl. No. 14/521,136, filed Oct. 22, 2014, SanDisk Technologies Inc.

U.S. Appl. No. 14/529,942, filed Oct. 31, 2014, SanDisk Technologies Inc.

U.S. Appl. No. 14/886,609, filed Oct. 19, 2015, SanDisk Technologies Inc.

USPTO Office Communication, Non-Final Office Action for U.S. Appl. No. 14/886,609, dated May 18, 2017, 19 pages.

\* cited by examiner

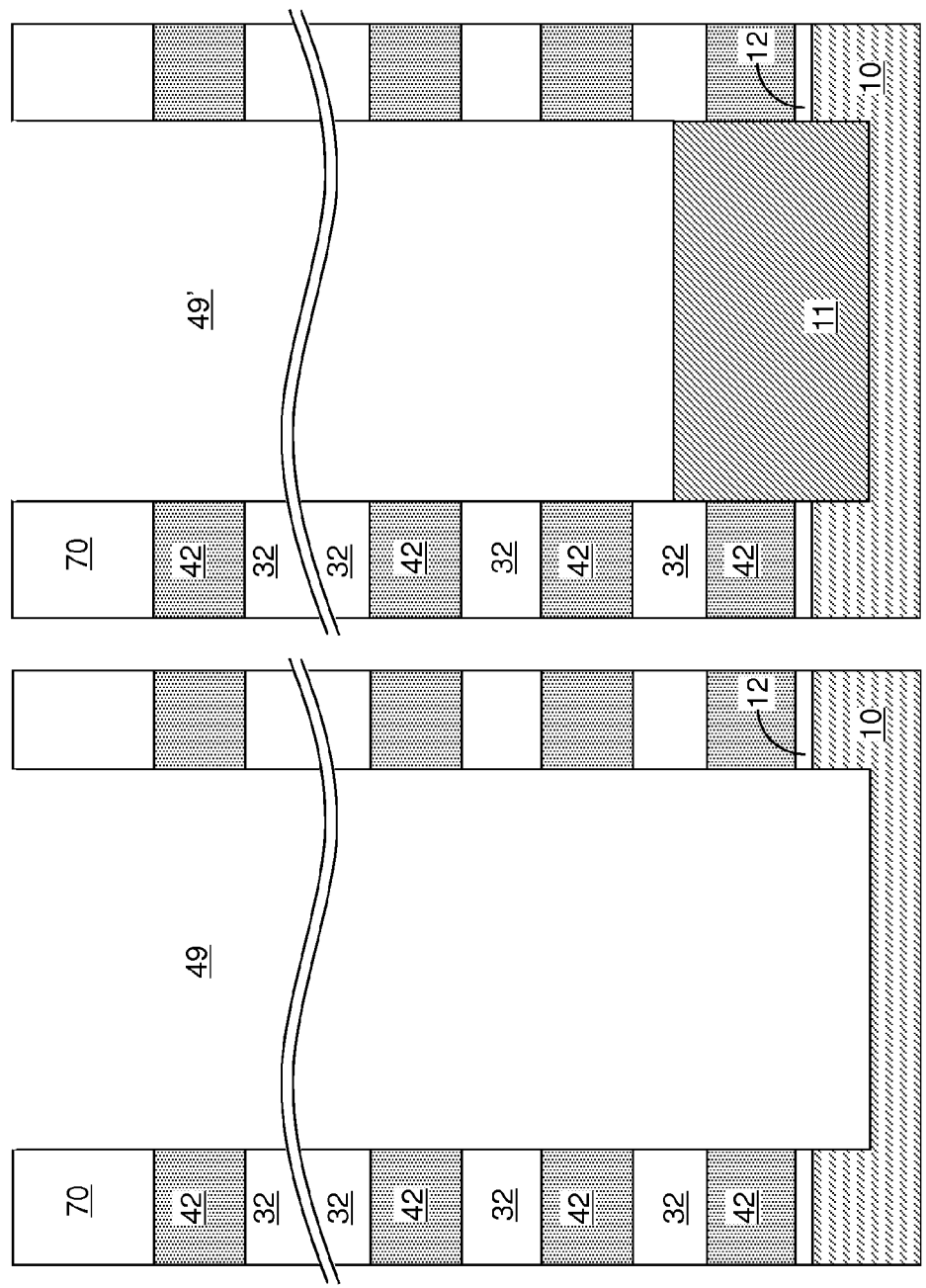

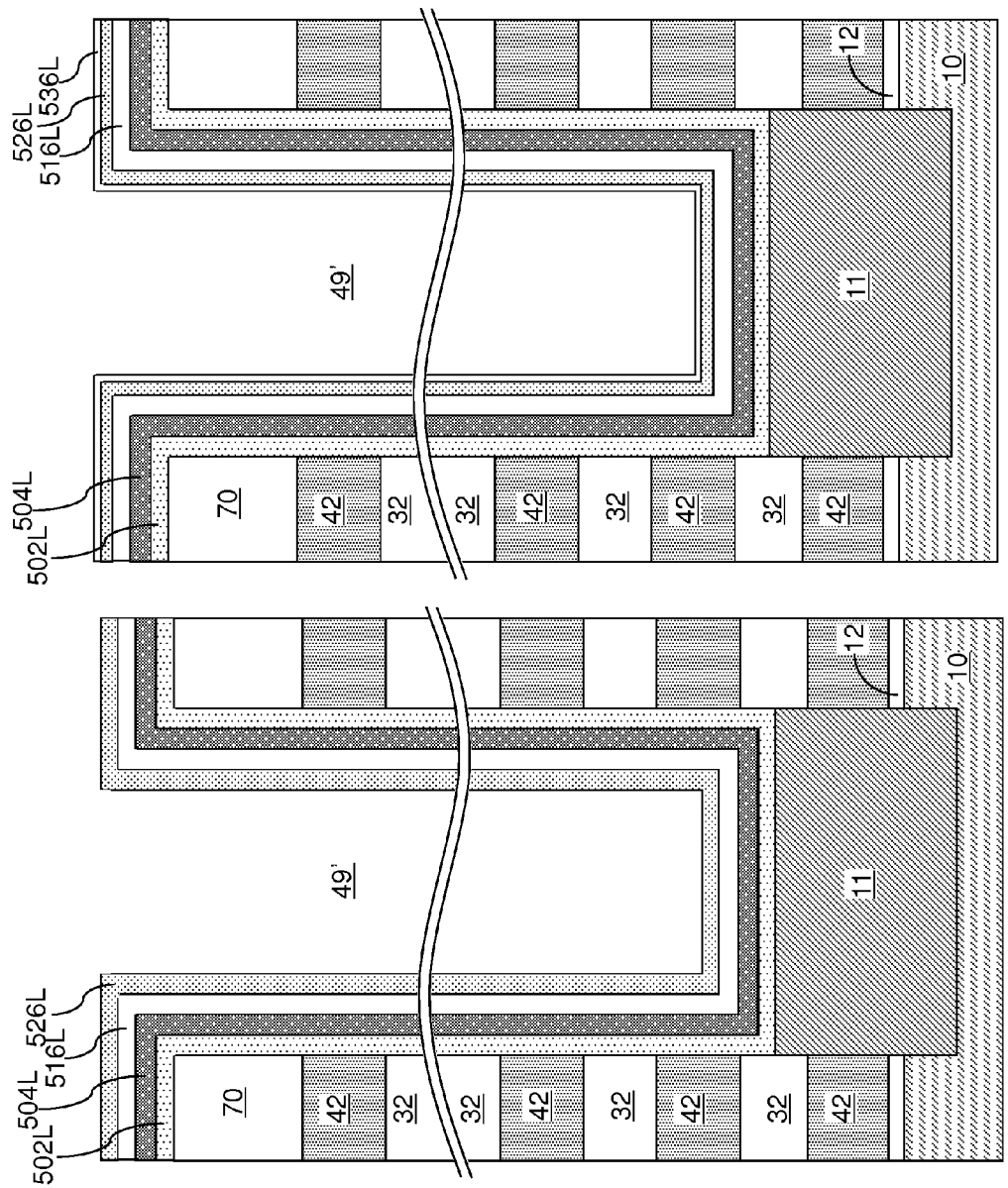

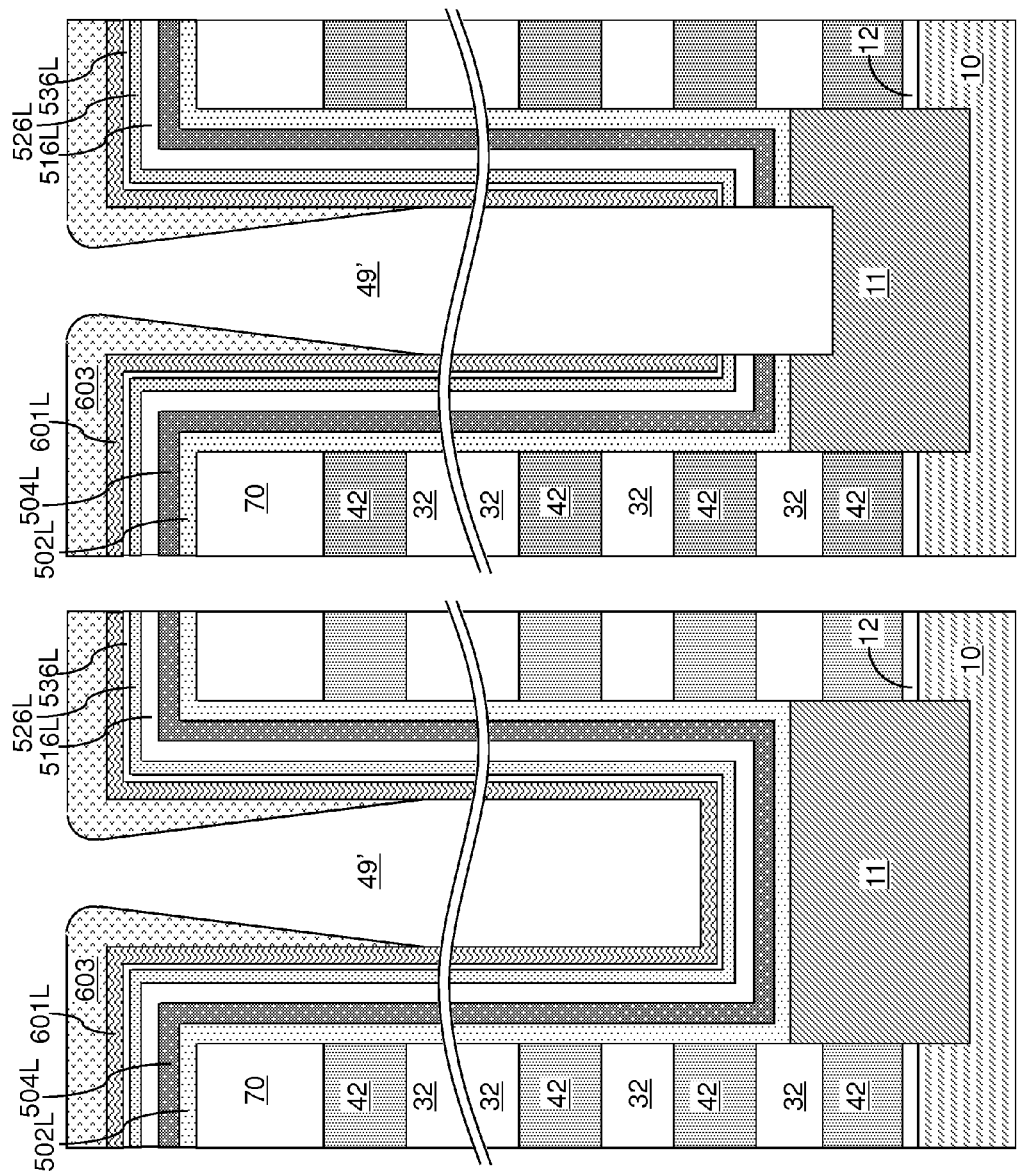

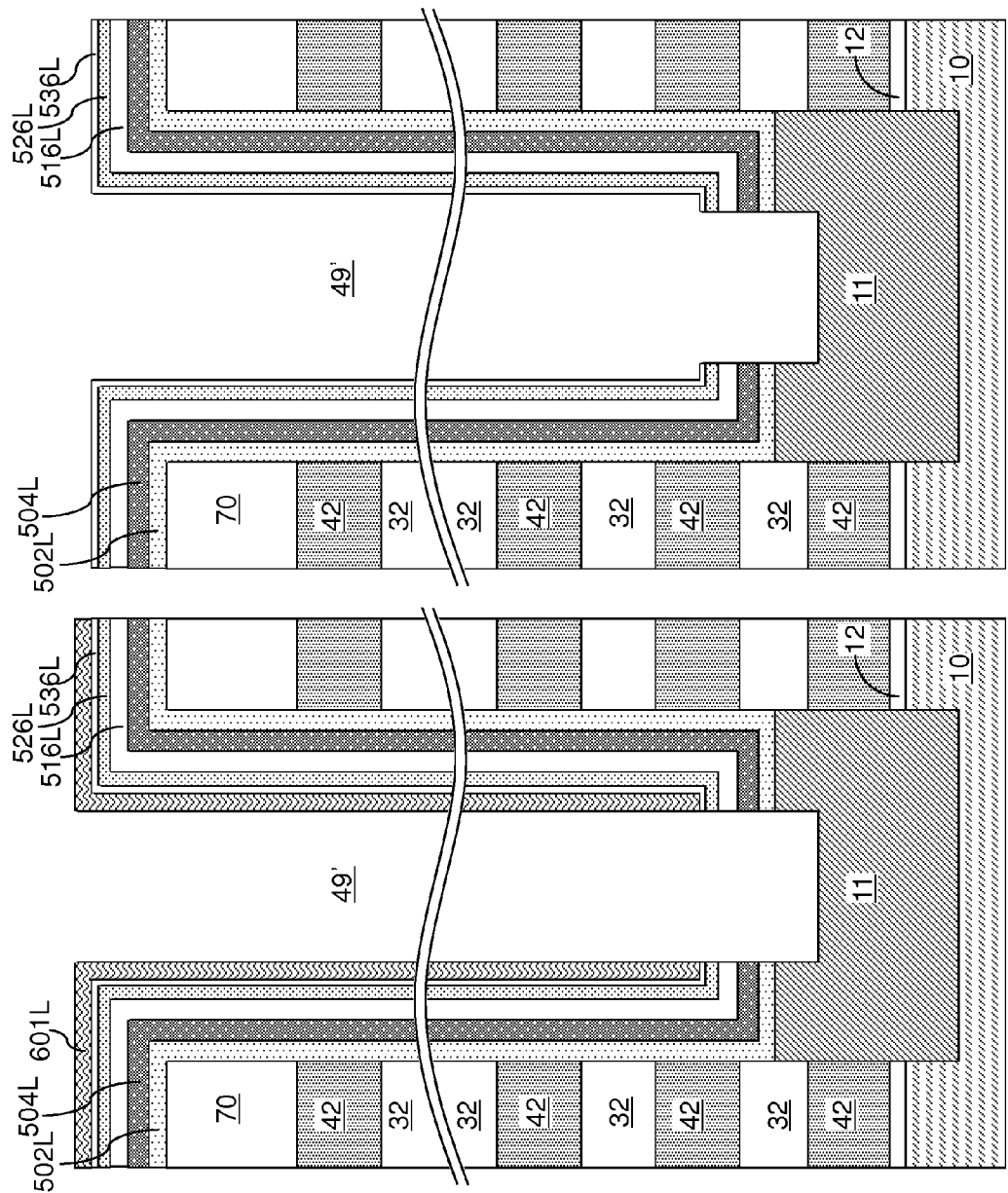

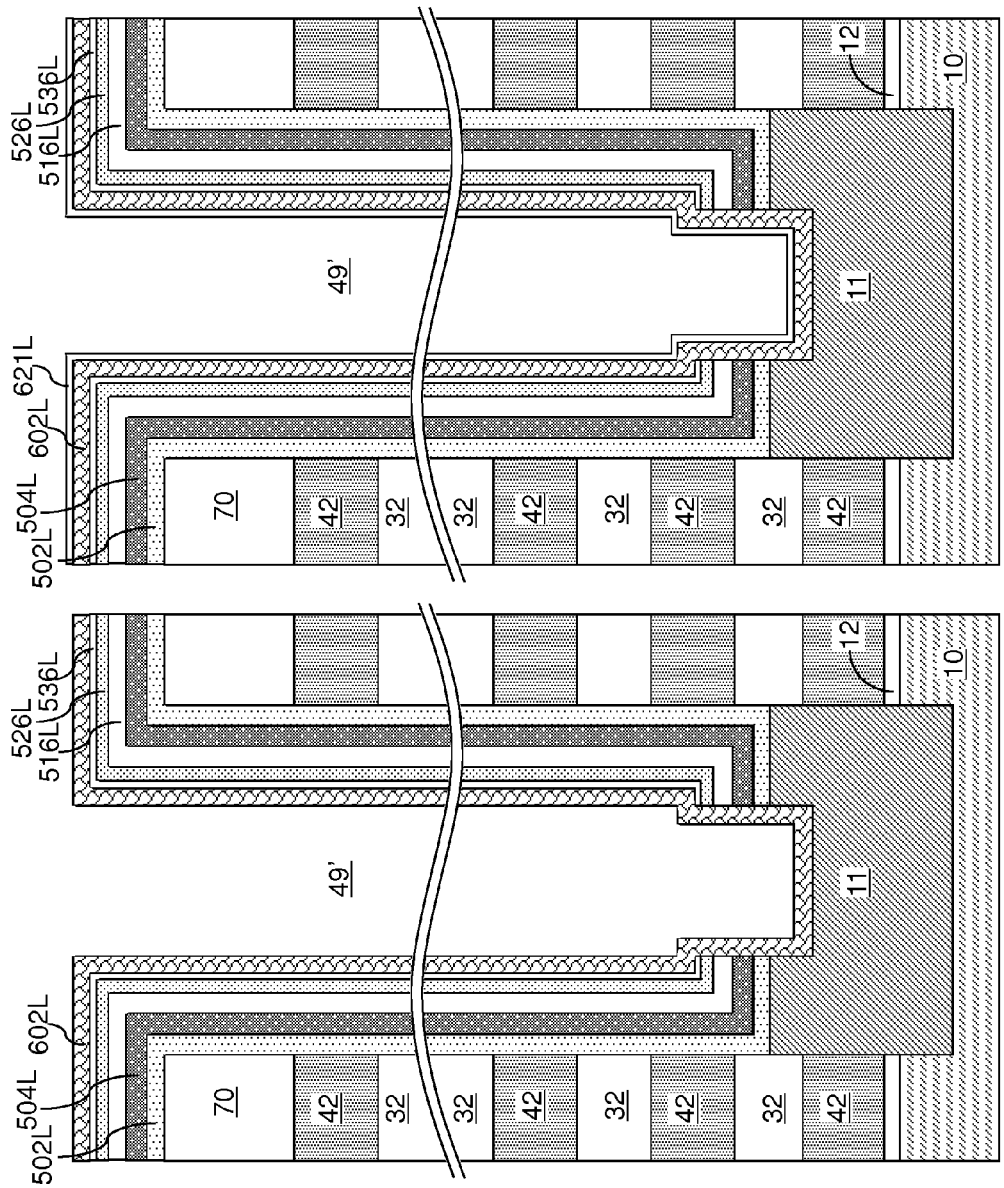

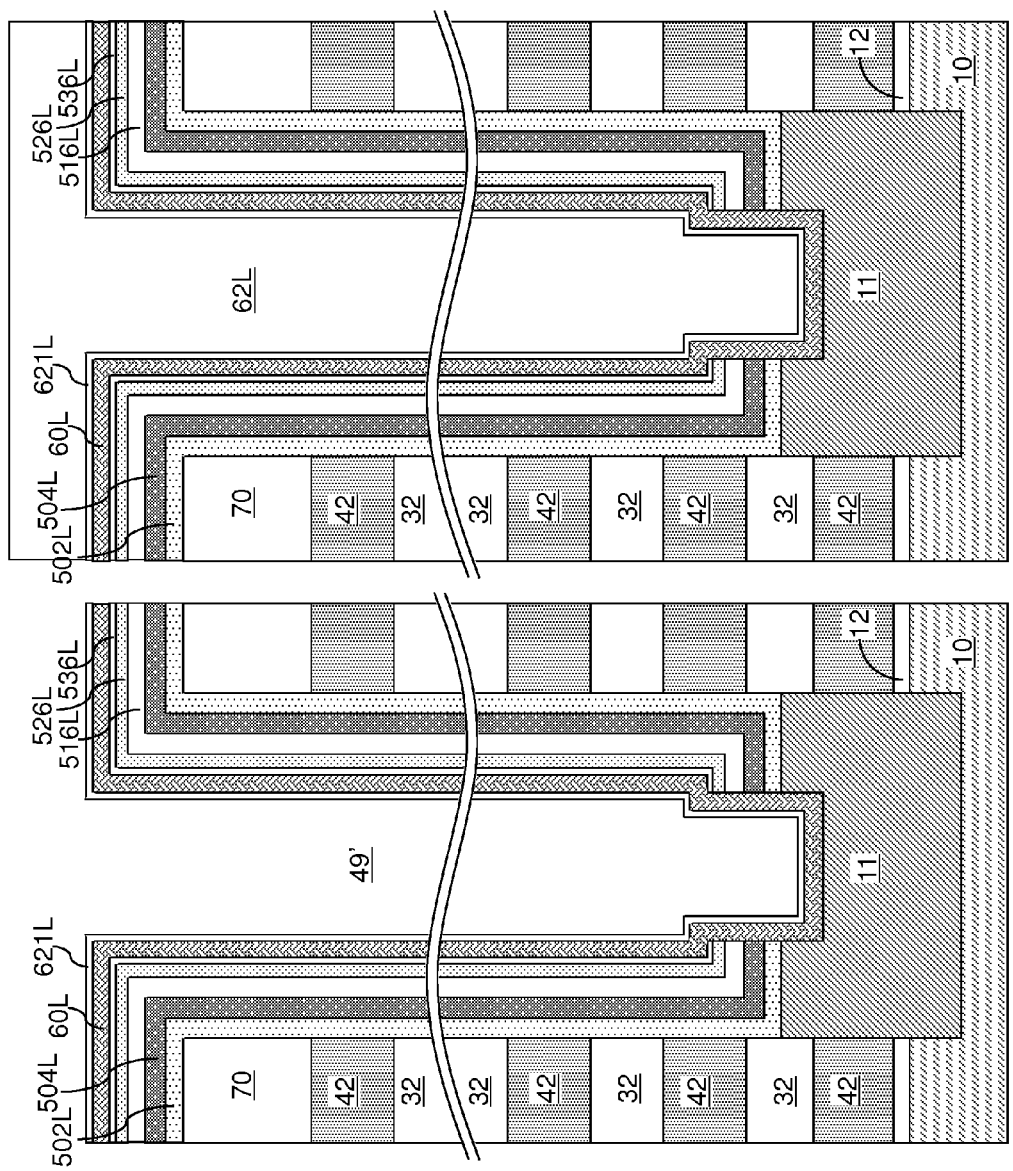

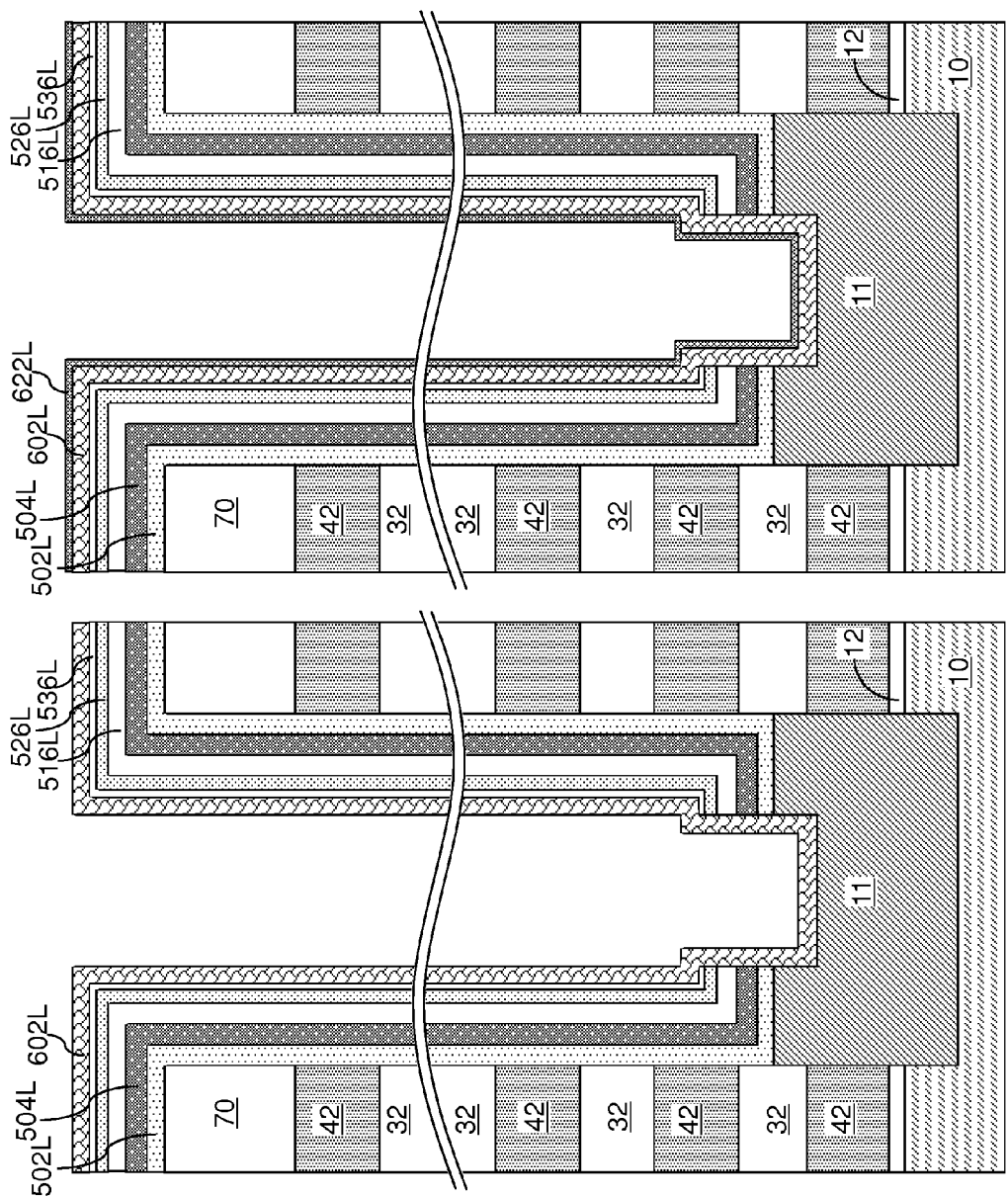

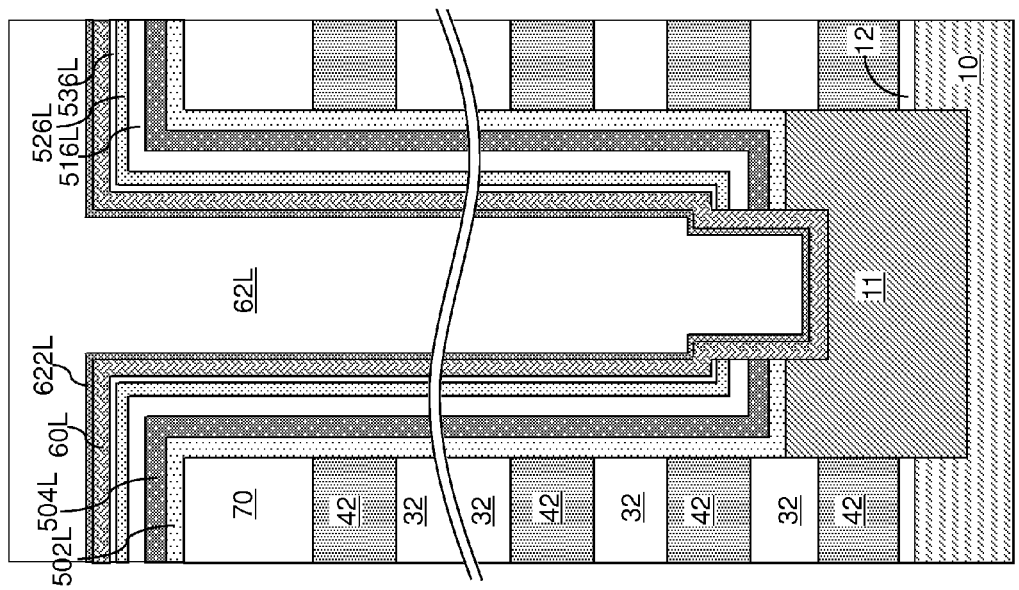
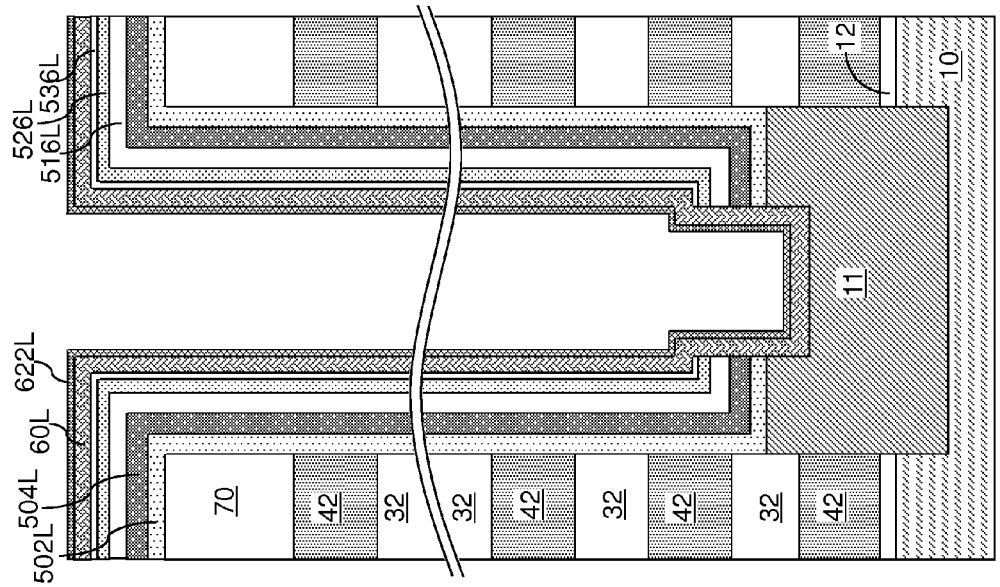

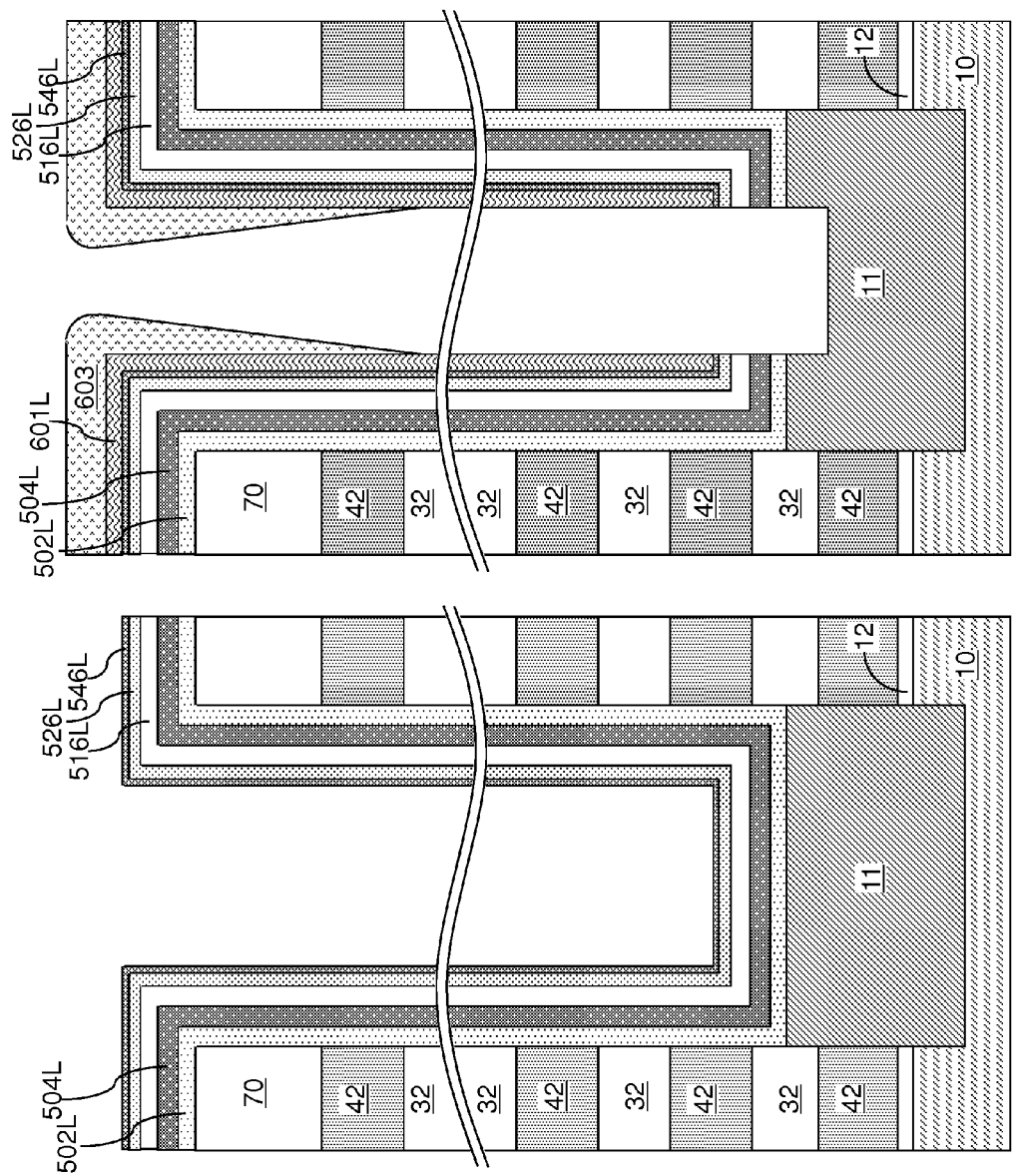

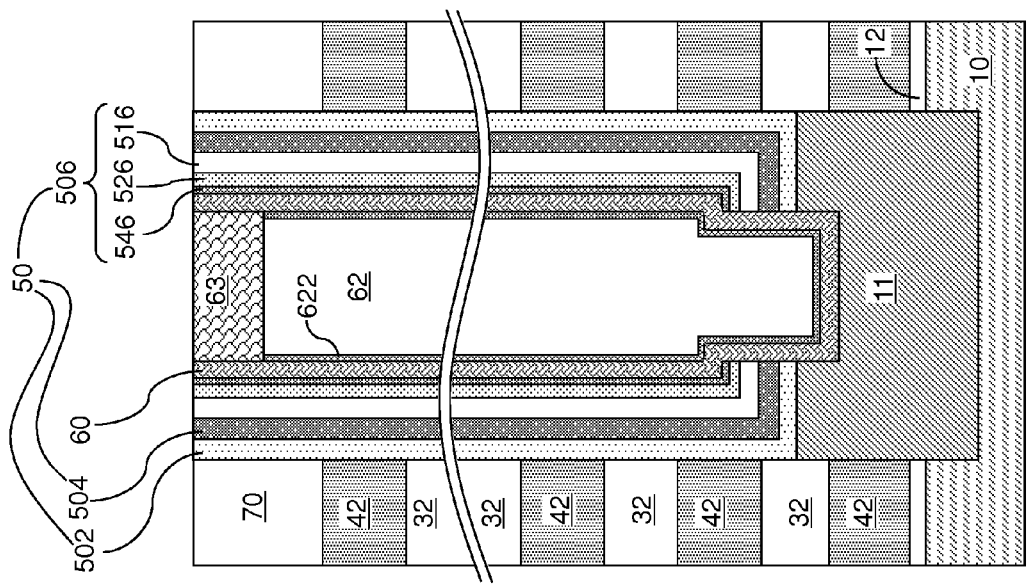
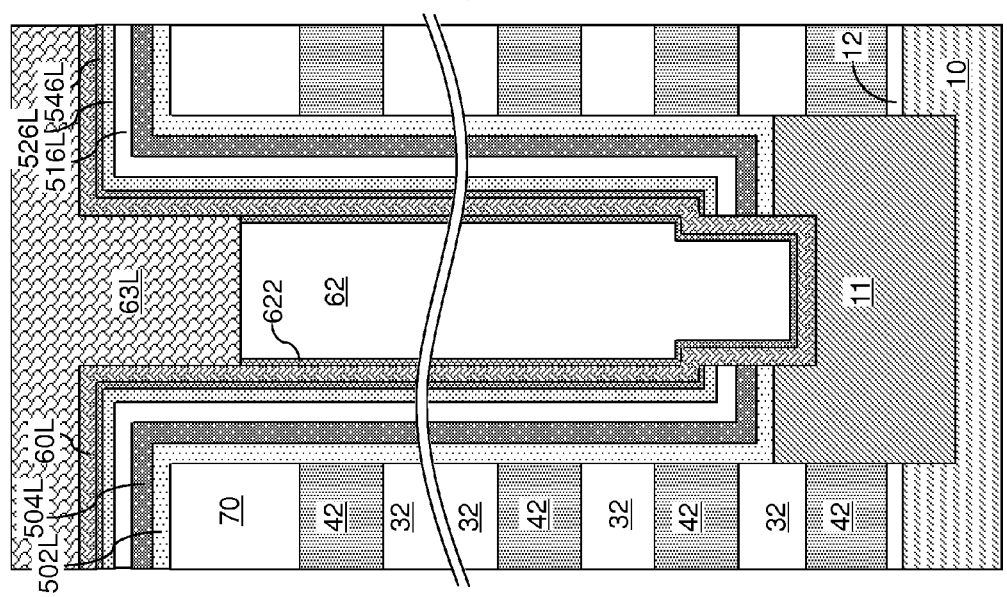
FIG. 4H
FIG. 4G

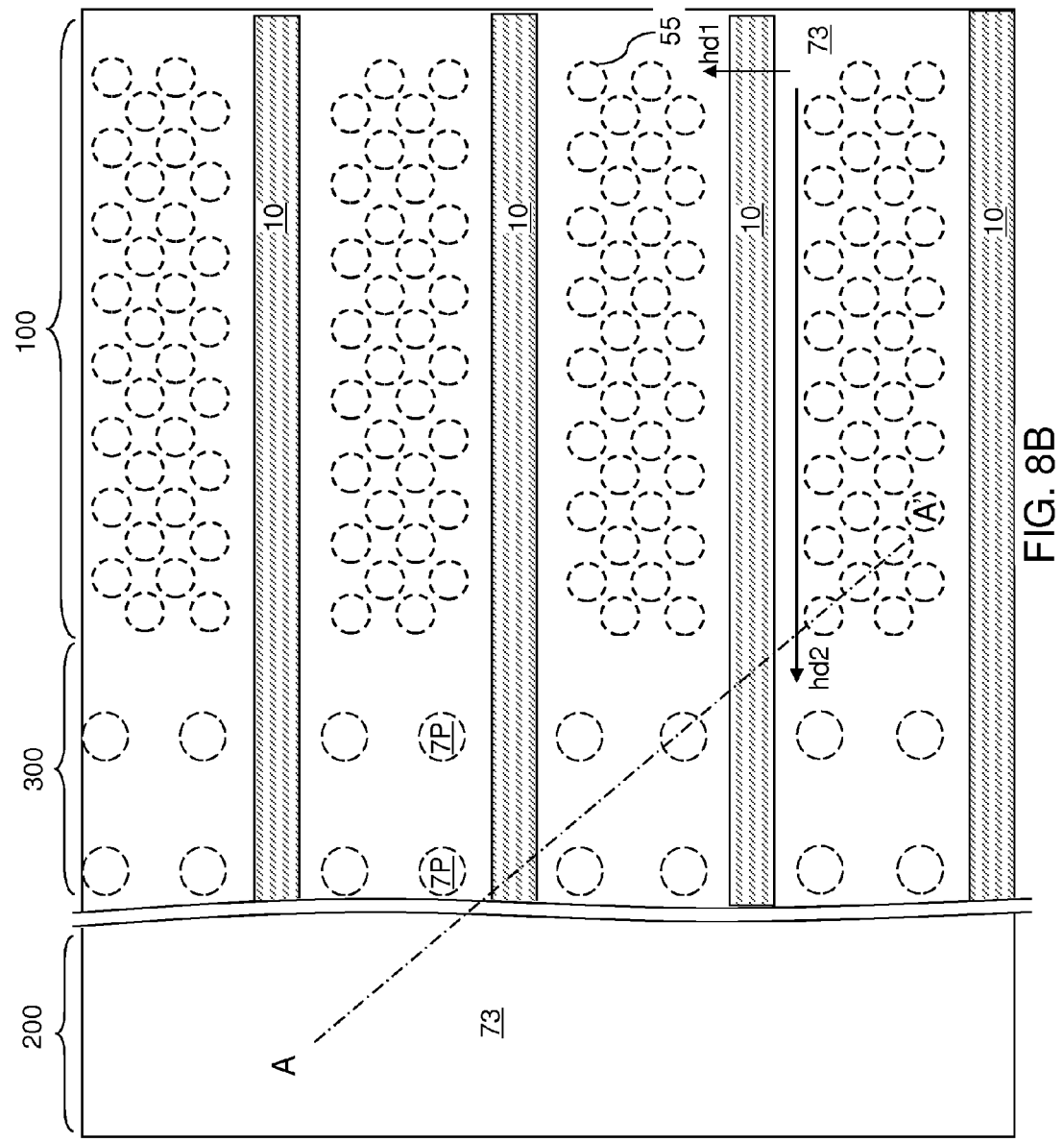

ULTRATHIN SEMICONDUCTOR CHANNEL THREE-DIMENSIONAL MEMORY DEVICES

FIELD

The present disclosure relates generally to the field of semiconductor devices and specifically to three-dimensional non-volatile memory devices, such as vertical NAND strings and other three-dimensional devices, and methods of making the same.

BACKGROUND

Recently, ultra high density storage devices have been proposed using a three-dimensional (3D) stacked memory structure sometimes referred to as a Bit Cost Scalable (BiCS) architecture. For example, a 3D NAND stacked memory device can be formed from an array of alternating conductive and dielectric layers. A memory opening is formed through the layers to define many memory layers simultaneously. A NAND string is then formed by filling the memory opening with appropriate materials. A straight NAND string extends in one memory opening, while a pipe- or U-shaped NAND string (p-BiCS) includes a pair of vertical columns of memory cells. Control gates of the memory cells may be provided by the conductive layers.

In conventional 3D NAND strings, a semiconductor channel including a stack of two amorphous silicon layers is employed. A first amorphous silicon layer is employed to cover sidewalls of a tunneling dielectric layer, and the second amorphous silicon layer is employed to provide electrical contact to an underlying semiconductor material. The overall thickness of the semiconductor channel is in a range from 15 nm to 20 nm. The use of two layers for the semiconductor channel leads to formation of a defective interface between the first and second amorphous silicon layers. The defective interface provides a high trap density, which degrade charge carrier mobility and cell current. High level of defects and grain boundaries may remain in the stack of two silicon layers that is obtained by annealing the stack of amorphous layers. Such defects and grain boundaries are detrimental to various performance metrics including the sub-threshold slope and the boosting potential.

SUMMARY

According to an aspect of the present disclosure, a three-dimensional memory device is provided, which comprises an alternating stack of insulating layers and electrically conductive layers and located over a substrate; and memory stack structures extending through the alternating stack. Each memory stack structure comprises a semiconductor channel doped with argon at an atomic concentration in a range from $1.0 \times 10^{17}/cm^3$ to $5.0 \times 10^{20}/cm^3$.

According to another aspect of the present disclosure, a three-dimensional memory device is provided, which comprises an alternating stack of insulating layers and electrically conductive layers and located over a substrate; and memory stack structures extending through the alternating stack. Each memory stack structure comprises a semiconductor channel having a thickness not greater than 5.0 nm and a first sidewall having a surface roughness not greater than 10% of the thickness of the semiconductor channel.

According to yet another aspect of the present disclosure, a three-dimensional memory device is provided, which comprises an alternating stack of insulating layers and electrically conductive layers and located over a substrate; and memory stack structures extending through the alternating stack. Each memory stack structure comprises a semiconductor channel including an inner sidewall in physical contact with an outer sidewall of an aluminum oxide layer.

According to even another aspect of the present disclosure, a method of forming a three-dimensional memory device is provided. An alternating stack of insulating layers and spacer material layers is formed over a substrate. Memory openings extending through the alternating stack are formed. A memory film and an amorphous semiconductor material layer are formed in the memory openings. A predominant portion of the amorphous semiconductor material layer is converted into an argon-doped semiconductor material layer including argon at an atomic concentration in a range from $1.0 \times 10^{17}/cm^3$ to $5.0 \times 10^{20}/cm^3$, although lesser and greater atomic concentrations can also be employed.

According to still another aspect of the present disclosure, a method of forming a three-dimensional memory device is provided. An alternating stack of insulating layers and spacer material layers is formed over a substrate. Memory openings extending through the alternating stack are formed. A memory stack structure is formed in each of the memory openings. A semiconductor channel within each memory stack structure comprises a polycrystalline semiconductor material layer that surrounds, and contacts an outer sidewall of, an aluminum oxide layer.

According to further another aspect of the present disclosure, a method of forming a three-dimensional memory device is provided. An alternating stack of insulating layers and spacer material layers is formed over a substrate. Memory openings extending through the alternating stack are formed. A memory film and an amorphous silicon layer are formed in the memory openings. A surface portion of the amorphous silicon layer is converted into a thermal silicon oxide layer. A dielectric core is formed over the semiconductor channel layer.

BRIEF DESCRIPTION OF THE DRAWINGS

FIGS. 3A-3F are sequential vertical cross-sectional views of a second exemplary memory stack structure during manufacture according to a second embodiment of the present disclosure.

FIGS. 4A-4H are sequential vertical cross-sectional views of a third exemplary memory stack structure during manufacture according to a third embodiment of the present disclosure.

FIG. 8B is a see-through top-down view of the exemplary structure of FIG. 8A. The vertical plane A-A' is the plane of the vertical cross-sectional view of FIG. 8A.

DETAILED DESCRIPTION

Figure 1:
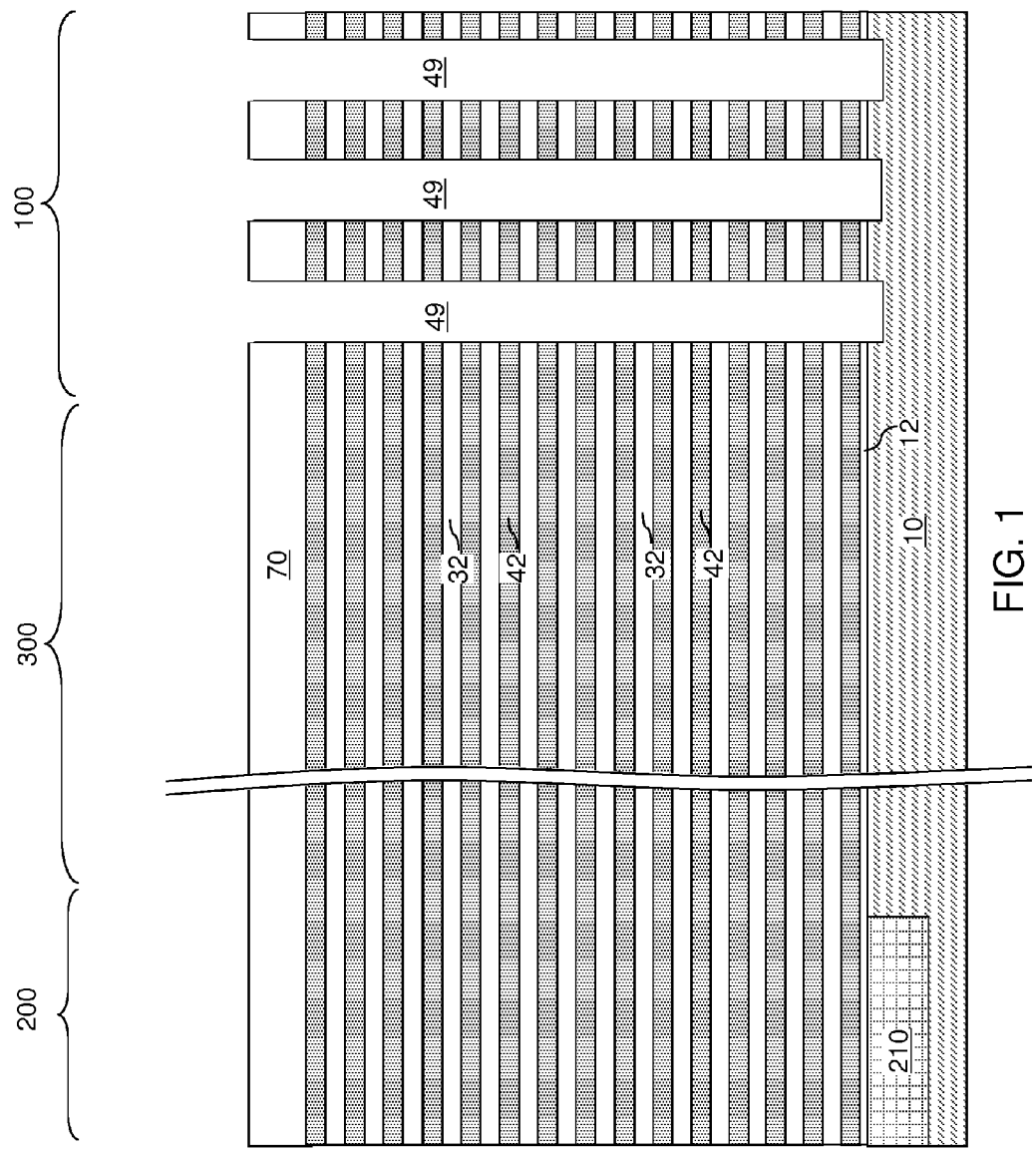
FIG. 1 is a vertical cross-sectional view of an exemplary structure after formation of an alternating stack of insulating layers and sacrificial material layers and memory openings extending through the alternating stack according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

The inventors of the present disclosure recognized that a three-dimensional memory device can employ an ultrathin semiconductor channel for a vertical field effect transistors controlled by a plurality of control gate electrodes. As used herein, an "ultrathin semiconductor channel" refers to a semiconductor channel of a transistor that has a thickness less than 5 nm. In one embodiment, an ultrathin semiconductor channel may have a thickness in a range from 2 nm to 5 nm. For example, an ultrathin semiconductor channel may have a thickness in a range from 3 nm to 4 nm.

In one aspect, the inventors of the present disclosure further recognized that a device with an ultrathin semiconductor channel can provide an enhanced device performance relative to a device having a thicker semiconductor channel (such as a semiconductor channel having a thickness greater than 5 nm) by sub-band engineering employing the principles of quantum physics. For example, electron mobility increases, and leakage is suppressed, due to quantum confinement and energy sub-band modulation effects in an ultrathin semiconductor channel. An ultrathin semiconductor channel has less grain boundaries and total number of defects compared with a thicker semiconductor channel. An ultrathin semiconductor channel may provide quantum confinement, energy sub-band modulation effects, increase in electron mobility and gate control, and hence increase in cell performance. Additionally, lower leakage from an ultrathin semiconductor channel leads to lower operation power and other benefits such as improvement of boosting potential and reduction in program disturbance. An ultrathin semiconductor channel also offers better scaling potential for memory openings.

According to an aspect of the present disclosure, an ultrathin semiconductor channel is employed in a three-dimensional memory device to provide benefits including, but not limited to, improvement in the quality of the semiconductor channel, improvement in film continuity, reduction of volume defects (such as elimination or reduction of pin holes), and improvement of interfaces with a tunneling dielectric layer and a core dielectric. Material layers and processes for improvement of interfaces can be employed to provide less interfacial defects and/or interface states, and to reduce surface roughness of the semiconductor channel.

The structures and methods of the embodiments of the present disclosure can be employed to reduce interface and volume defects, and to reduce the surface roughness. Reduction of the interface and volume defects and the surface roughness aid in realizing the benefits of an ultrathin semiconductor channel. In one embodiment, a continuous ultrathin single polycrystalline semiconductor material layer (such as a polysilicon layer) that does not include any interface between multiple layers therein can offer enhanced channel quality compared with a stack of multiple semiconductor material layers. Grain boundaries in an ultrathin polycrystalline semiconductor channel formed by a single step deposition process are more likely to run along directions substantially perpendicular to the lengthwise direction (vertical direction) of the semiconductor channel than a stack of multiple semiconductor material layers. Thus, less traps for electron states are present in an ultrathin polycrystalline semiconductor channel formed by a single step deposition process than in a stack of multiple semiconductor material layers. In other words, an ultrathin polycrystalline semiconductor channel formed by a single step deposition process provides a better quality semiconductor channel than a stack of multiple semiconductor material layers having comparable overall dimensions.

Current-voltage (I-V) variability and program variability/noise due to the distribution of the grain sizes and the boundary effect within a polycrystalline semiconductor channel can affect the variability of channel current as a function of drain-to-source voltage, i.e., the "I-V variability," and program variability and program noise, i.e., the variability and noise in programmed threshold voltage (Vt). For example, additional grain boundaries formed during a multi-stack polycrystalline semiconductor channel lead to formation of more grain boundaries and more defects, resulting in adverse consequences such as lower cell current and increased variability and program noise. In contrast, the single step deposition process employed in the embodiments of present disclosure can increase cell current and provide less program variability and noise.

An ultrathin semiconductor channel, which can have a thickness in a range from 2 nm to about 4.5 nm or 5 nm, has additional benefits derived from quantum confinement of charge carriers and mobility enhancement due to the quantum confinement. Larger grain sizes in an ultrathin semiconductor channel provide less grain boundary defects and trap defects, enhanced cell performance, and reduced cell-to-cell performance variability. For example, the ultrathin semiconductor channel can employ an undoped (i.e., not intentionally doped) polycrystalline semiconductor material.

A large-grain polycrystalline semiconductor material of an ultrathin semiconductor channel can include a 2-dimensional electron gas (2DEG). When the thickness of a semiconductor channel becomes less than about 5 nm, electron state quantization occurs due to quantum confinement and energy sub-band modulation effects, resulting in an increase in electron mobility.

Significant mobility increase can be provided in an ultrathin semiconductor channel due to quantum confinement effects. Quantum confinement effects are strongest at film thickness in a range from about 2 nm to about 4.5 nm due to sub-band energy modulation effects. Quantum confinement effects in a large-grain ultrathin polycrystalline semiconductor channel are similar to quantum confinement effects in a single crystalline semiconductor material in a semiconductor-on-insulator (SOI) structure. Occupancy of electrons in a 2-fold valley in the Brillouin zone in the k-space increases as the semiconductor film thickness (of a semiconductor channel) decreases. Since electrons in the 2-fold valley have smaller conductivity mass than those in 4-fold valleys, total mobility increases as the thickness of the semiconductor film decreases. Thus, electron mobility as a function of the channel thickness can reach a global maximum at a thickness between 2.5 nm and 3.5 nm.

Thus, for a silicon-based metal-oxide-semiconductor field effect transistor (MOSFET), a method to enhance the drive current of the silicon-based MOSFETs is to employ sub-band structure engineering. A silicon-on-insulator (SOI) MOSFET with a silicon channel thickness less than the thickness of the inversion layer of a bulk silicon MOSFET can provide higher drive current than the bulk silicon MOSFET because of significant modulation of the sub-band structure. Performance enhancement is attributed to increase in both the inversion layer mobility and the inversion layer capacitance. Thus, optimizing the sub-band structure of the inversion layer can improve the performance of a MOSFET significantly. Specifically, 2-fold valleys on a (100) surface are optimum electronic system for silicon since the 2-fold valleys provide lower effective mass parallel to the Si/SiO$_2$ interface of the silicon-on-insulator substrate and a higher effective mass perpendicular to interface. The lower effect mass parallel to the Si/SiO$_2$ interface increases mobility along the channel direction. The higher effective mass perpendicular to interface increases the inversion layer capacitance $C_{inv}$.

The occupancy of the 2-fold valleys is determined by the sub-band energy difference $\Delta E_o$ between the 4-fold and the 2-fold valleys. The occupancy of the 2-fold valleys is not sufficiently large for bulk MOSFETs at room temperature because of the sub-band energy difference $\Delta E_o$ is small. The sub-band energy difference $\Delta E_o$ for an ultrathin semiconductor channel is greater than the corresponding sub-band energy difference for a thick semiconductor channel. Thus, the occupancy of the 2-fold valleys increases for an ultrathin semiconductor channel relative to a thick semiconductor channel, thereby providing an increase in the transconductance $g_m$ in the semiconductor channel.

Since the band structure of SOI MOSFETs having a thick silicon channel (e.g., greater than 20 nm in thickness) is the same as the band structure of bulk MOSFETs, the charge carrier mobility of SOI MOSFETs is the same as the charge carrier mobility of bulk MOSFETs. As the thickness of a silicon channel becomes thinner than 20 nm, the thickness of the semiconductor channel starts to limit the extent of the wave function of charge carriers, particularly in the 4-fold valleys. As the thickness of the silicon channel decreases below 20 nm, therefore, the charge carrier mobility of SOI MOSFETs slightly decreases from the bulk value, which is mostly attributable to a decrease in the thickness of the inversion-layer.

When the thickness of the semiconductor channel becomes thinner than 5 nm, sub-band energy of 4-fold valleys is lifted up because of the size effect that occurs in an ultrathin semiconductor channel. As a result, the occupancy of the 2-fold valleys and the charge carrier mobility increase simultaneously. In addition, since the increase in the sub-band energy difference $\Delta E_o$ can suppress inter-valley scattering from the 2-fold valleys to the 4-fold valleys, charge carrier mobility in the 2-fold valleys can also increase.

A further benefit of an ultrathin semiconductor channel is reduction of the leakage current. Quantum-confinement mechanism is effective to reduce leakage current in a polycrystalline semiconductor channel thin film transistor (TFT) as long as the thickness of the polycrystalline semiconductor channel is less than 5 nm. Both on-current and off-current are dependent on the thickness of the polycrystalline semiconductor channel. However, the off-current is exponentially dependent on the thickness, i.e., the dependence of the off-current on the thickness is much stronger than the dependence of the on-current on the thickness.

The inventors of the present disclosure further recognized that control of surface roughness is important in providing quantum confinement and mobility enhancement in the ultrathin semiconductor channel. Improvement of channel volume quality can be provided through improving film continuity and through eliminating, or reducing, volume defects such as pin holes. Control of the interfaces of the ultrathin semiconductor channel with the tunneling dielectric and a dielectric core can be provided through interface improvement films, i.e., films that improve the interface characteristics, and through processes for forming the same. Such interface improvement films can reduce defects, interface states, and surface roughness. Mobility degradation in the ultrathin polycrystalline semiconductor channel can be controlled and limited by reducing the channel surface roughness.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (e.g., a single crystalline silicon wafer). The substrate can include a substrate semiconductor layer 10. The substrate semiconductor layer 10 may be an upper portion of the silicon wafer or it may be a semiconductor material layer located over a top surface of the silicon wafer, and can include at least one elemental semiconductor material (e.g., silicon, such as single crystalline silicon), at least one III-V compound semiconductor material, at least one II-VI compound semiconductor material, at least one organic semiconductor material, or other semiconductor materials known in the art.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition. The substrate semiconductor layer 10 can include at least one doped well (not expressly shown) having a substantially uniform dopant concentration therein. Well doping may or may not be graded. Well doping can be provided by ion implantation with subsequent diffusion during thermal steps.

The exemplary structure can have multiple regions for building different types of devices. Such areas can include, for example, a device region 100, a contact region 300, and a peripheral device region 200. In one embodiment, the substrate semiconductor layer 10 can include at least one doped well in the device region 100. As used herein, a "doped well" refers to a portion of a semiconductor material having a doping of a same conductivity type (which can be p-type or n-type) and a substantially same level of dopant concentration throughout. The doped well can be the same as the substrate semiconductor layer 10 or can be a portion of the substrate semiconductor layer 10. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0 \times 10^{15}/cm^3$ to $1.0 \times 10^{18}/cm^3$, although lesser and greater dopant concentration levels can also be employed. As used herein, a dopant concentration level refers to average dopant concentration for a given region.

Peripheral devices 210 can be formed in, or on, a portion of the substrate semiconductor layer 10 located within the peripheral device region 200. The peripheral devices can include various devices employed to operate the memory devices to be formed in the device region 100, and can include, for example, driver circuits for the various components of the memory devices. The peripheral devices 210 can include, for example, field effect transistors and/or passive components such as resistors, capacitors, inductors, diodes, etc.

Optionally, a gate dielectric layer 12 can be formed above the substrate semiconductor layer 10. The gate dielectric layer 12 can be employed as the gate dielectric for a first source select gate electrode. The gate dielectric layer 12 can include, for example, silicon oxide and/or a dielectric metal oxide (such as $HfO_2$, $ZrO_2$, $LaO_2$, etc.). The thickness of the gate dielectric layer 12 can be in a range from 3 nm to 30 nm, although lesser and greater thicknesses can also be employed.

An alternating stack of first material layers (which can be insulating layers 32) and second material layers (which are referred to spacer material layers) is formed over the top surface of the substrate, which can be, for example, on the top surface of the gate dielectric layer 12. As used herein, a "material layer" refers to a layer including a material throughout the entirety thereof. As used herein, a "spacer material layer" refers to a material layer that is located between two other material layers, i.e., between an overlying material layer and an underlying material layer. The spacer material layers can be formed as electrically conductive layers, or can be replaced with electrically conductive layers in a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the top surface of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

A lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form first memory openings 49. In other words, the transfer of the pattern in the patterned lithographic material stack through the alternating stack (32, 42) forms the first memory openings that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the first memory openings can be substantially vertical, or can be tapered. The patterned lithographic material stack can be subsequently removed, for example, by ashing.

A memory stack structure can be formed in each of the memory opening. FIGS. 2A-2H illustrate sequential vertical cross-sectional views of a memory opening during formation of a first exemplary memory stack structure. Formation of the first exemplary memory stack structure can be performed within each of the memory openings 49 in the exemplary structure illustrated in FIG. 1.

Referring to FIG. 2A, a memory opening 49 is illustrated. The memory opening 49 extends through the insulating cap layer 70, the alternating stack (32, 42), and the gate dielectric layer 12, and optionally into an upper portion of the substrate semiconductor layer 10. The recess depth of the bottom surface of each memory opening 49 with respect to the top surface of the substrate semiconductor layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an epitaxial channel portion 11 can be optionally formed at the bottom of each memory opening 49 by selective epitaxy of a semiconductor material. During the selective epitaxy process, a reactant gas and an etchant gas can be simultaneously or alternatively flowed into a process chamber. Semiconductor surfaces and dielectric surfaces of the exemplary structure provide different nucleation rates for the semiconductor material. By setting the etch rate (determined by the flow of the etchant gas) of the semiconductor material greater than the nucleation rate of the semiconductor material on the dielectric surfaces and less than the nucleation rate of the semiconductor material on the semiconductor surfaces, the semiconductor material can grow from the physically exposed semiconductor surfaces (i.e., from the physically exposed surfaces of the substrate semiconductor layer 10 at the bottom of each memory opening 49. Each portion of the deposited semiconductor material constitutes an epitaxial channel portion 11, which comprises a single crystalline semiconductor material (e.g., single crystalline silicon) in epitaxial alignment with the single crystalline semiconductor material of the substrate semiconductor layer 10. Thus, an epitaxial channel portion 11 is formed at a bottom of each memory opening 49 and directly on a single crystalline semiconductor surface of the substrate semiconductor layer 10, which is an uppermost portion of the substrate. Each epitaxial channel portion 11 functions as a portion of a channel of a vertical field effect transistor. The top surface of the epitaxial channel portion 11 can be between a pair of sacrificial material layers 42. In other words, a periphery of each epitaxial channel portion 11 can be in physical contact with a sidewall of an insulating layer 32. A cavity 49' is present over an epitaxial channel portion 11 in each memory opening 49.

Referring to FIG. 2C, a series of layers including at least one blocking dielectric layer 502L, a continuous memory material layer 504L, and at least one in-process tunneling dielectric layer (516L, 526L) can be sequentially deposited in the memory openings 49. The at least one in-process tunneling dielectric layer (516L, 526L) are layers that are incorporated, with or without modification, into a tunneling dielectric layer of a final device structure, and can include, for example, a first tunneling dielectric layer 516L and a second tunneling dielectric layer 526L.

The at least one blocking dielectric layer 502L can include, for example, a stack including a first blocking dielectric layer and a second blocking dielectric layer. In an illustrative example, the first blocking dielectric layer can be deposited on the sidewalls of each memory opening 49 by a conformal deposition method. The first blocking dielectric layer includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer can be deposited, for example, by chemical vapor deposition (CVD), atomic layer deposition (ALD), pulsed laser deposition (PLD), liquid source misted chemical deposition, or a combination thereof. The thickness of the first blocking dielectric layer can be in a range from 1 nm to 20 nm, although lesser and greater thicknesses can also be employed. The first blocking dielectric layer can subsequently function as a dielectric material portion that blocks leakage of stored electrical charges to control gate electrodes. In one embodiment, the first blocking dielectric layer includes aluminum oxide.

The second blocking dielectric layer can be formed on the first blocking dielectric layer. The second blocking dielectric layer can include a dielectric material that is different from the dielectric material of the first blocking dielectric layer. In one embodiment, the second blocking dielectric layer can include silicon oxide, a dielectric metal oxide having a different composition than the first blocking dielectric layer, silicon oxynitride, silicon nitride, or a combination thereof. In one embodiment, the second blocking dielectric layer can include silicon oxide. The second blocking dielectric layer can be formed by a conformal deposition method such as low pressure chemical vapor deposition, atomic layer deposition, or a combination thereof. The thickness of the second blocking dielectric layer can be in a range from 1 nm to 20 nm, although lesser and greater thicknesses can also be employed. Alternatively, the first blocking dielectric layer and/or the second blocking dielectric layer can be omitted, and a blocking dielectric layer can be formed after formation of backside recesses on surfaces of memory films to be subsequently formed.

The continuous memory material layer 504L is sequentially formed. In one embodiment, the continuous memory material layer 504L can be a charge trapping material including a dielectric charge trapping material, which can be, for example, silicon nitride. Alternatively, the continuous memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the continuous memory material layer 504L includes a silicon nitride layer.

The continuous memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material).

Alternatively or additionally, the continuous memory material layer 504L may comprise an insulating charge trapping material, such as one or more silicon nitride segments. Alternatively, the continuous memory material layer 504L may comprise conductive nanoparticles such as metal nanoparticles, which can be, for example, ruthenium nanoparticles. The continuous memory material layer 504L can be formed, for example, by chemical vapor deposition (CVD), atomic layer deposition (ALD), physical vapor deposition (PVD), or any suitable deposition technique for storing electrical charges therein. The thickness of the continuous memory material layer 504L can be in a range from 2 nm to 20 nm, although lesser and greater thicknesses can also be employed.

The at least one in-process tunneling dielectric layer (516L, 526L) include dielectric materials through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. Each of the tunneling dielectric layers (516L, 526L) can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof.

In one embodiment, the first tunneling dielectric layer 516L can include a silicon oxide layer that is deposited by a conformal deposition method such as chemical vapor deposition (CVD). In one embodiment, the first tunneling dielectric layer 516L can include a silicon oxide layer that is substantially free of carbon. The thickness of the first tunneling dielectric layer 516L can be in a range from 1 nm to 6 nm, although lesser and greater thicknesses can also be employed.

The second tunneling dielectric layer 526L includes another dielectric material layer, which can be, for example, a silicon nitride layer or a silicon oxynitride layer. If the second tunneling dielectric layer 526L includes a silicon nitride layer, the silicon nitride layer can be formed by a conformal deposition process such as chemical vapor deposition. If the second tunneling dielectric layer 526L includes a silicon oxynitride layer, the silicon oxynitride layer can be formed by conformal deposition of a silicon nitride layer and a subsequent oxidation process that converts the silicon nitride layer into a silicon oxynitride layer or a stack of a silicon nitride layer and a silicon oxynitride layer. Optionally, an additional silicon oxynitride layer can be formed on the silicon nitride layer or the stack of the silicon nitride layer and the silicon oxynitride layer. If two silicon oxynitride layers are provided, the oxygen to nitrogen ratios can be different in the two silicon oxynitride layers. The last layer, i.e., the innermost layer, among the at least one in-process tunneling dielectric layer (516L, 526L) includes a dielectric material containing at least silicon and nitrogen. In one embodiment, the second tunneling dielectric layer 526L provides physically exposed surfaces of silicon nitride or silicon oxynitride upon formation thereof. The thickness of the second tunneling dielectric layer 526L can be in a range from 1 nm to 6 nm, although lesser and greater thicknesses can also be employed.

Referring to FIG. 2D, a surface portion of the at least one in-process tunneling dielectric layer (516L, 526L) is converted into a thermal silicon oxide layer 536L. As used herein, "thermal silicon oxide" refers to a silicon oxide formed by thermal conversion of a silicon-containing material such as silicon nitride or silicon oxide in an oxygen-containing ambient. A thermal silicon oxide layer can be substantially free of carbon, and can have a stoichiometric composition of $SiO_2$. For example, a surface portion of the second tunneling dielectric layer 526L can be converted into the thermal silicon oxide layer 536L, while another portion of the second tunneling dielectric layer 526L remains underneath the thermal silicon oxide layer 536L with a composition that is substantially the same as the original composition of the second tunneling dielectric layer 526L as formed. The first tunneling dielectric layer 516L, the second tunneling dielectric layer 526L, and the thermal silicon oxide layer 536L collectively constitute a tunneling dielectric layer (516L, 526L, 536L).

Referring to FIG. 2E, a sacrificial cover material layer 601L can be deposited on the physically exposed surfaces of the thermal silicon oxide layer 536L. The sacrificial cover material layer 601L includes a sacrificial material that protects the vertical portions of the tunneling dielectric layer (516L, 526L, 536L) in a subsequent anisotropic etch process. The sacrificial cover material layer 601L can include an amorphous semiconductor material (such as amorphous silicon), a polycrystalline semiconductor material (such as polysilicon), amorphous carbon, or a combination thereof. The sacrificial cover material layer 601L can be deposited by a conformal deposition method such as chemical vapor deposition (CVD). The thickness of the sacrificial cover material layer 601L can be in a range from 1 nm to 10 nm, although lesser and greater thicknesses can also be employed.

A non-conformal protective film 603 can be optionally deposited to protect upper portions of the sacrificial cover material layer 601L in a subsequent anisotropic etch process. The non-conformal protective film 603 can comprise, for example, a carbon-based hardmask material such as Advanced Patterning Film (APF) by Applied Materials, Inc.™ The thickness of the non-conformal protective film 603 can decrease as a function of distance from the horizontal plane including the topmost surface of the sacrificial cover material layer 601L, and the amount of the material of the non-conformal protective film 603 at a bottom portion of each memory opening can be insignificant.

Referring to FIG. 2F, an anisotropic etch is performed to etch the physically exposed portions of the sacrificial cover material layer 601L, the tunneling dielectric layer (616L, 626L, 636L), the continuous memory material layer 504L, the at least one blocking dielectric layer 502L from the bottom portion of each memory opening 49. If present, the non-conformal protective film 603 can be employed as an etch mask. An opening is formed at the bottom of each memory opening 49 through the horizontal portions of the optional non-conformal protective film 603, the sacrificial cover material layer 601L, the tunneling dielectric layer (616L, 626L, 636L), the continuous memory material layer 504L, the at least one blocking dielectric layer 502L. An overetch can be performed such that a top surface of each epitaxial channel portion 11 is vertically recessed with respect to the bottommost horizontal surface of the at least one blocking dielectric layer 502L. The non-conformal protective film 603 and the sacrificial cover material layer 601L can provide protection to the tunneling dielectric layer (616L, 626L, 636L) during the anisotropic etch process.

In one embodiment, the sacrificial cover material layer 601L, the tunneling dielectric layer (616L, 626L, 636L), the continuous memory material layer 504L, the at least one blocking dielectric layer 502L can have vertically coincident sidewalls at each opening therethrough. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down. A surface of the epitaxial channel portion 11 (or a surface of the substrate semiconductor layer 10 in case the epitaxial channel portions 11 are not employed) can be physically exposed underneath each opening through the sacrificial cover material layer 601L, the tunneling dielectric layer (616L, 626L, 636L), the continuous memory material layer 504L, the at least one blocking dielectric layer 502L.

Referring to FIG. 2G, the non-conformal protective film 603, if present, can be removed selective to the sacrificial cover material layer 601L, for example, by ashing. Sidewalls of the sacrificial cover material layer 601L can be physically exposed after removal of the non-conformal protective film 603.

Referring to FIG. 2H, the sacrificial cover material layer 601L can be removed selective to the tunneling dielectric layer (616L, 626L, 636L). If the sacrificial cover material layer 601 comprises amorphous silicon, a wet etch chemistry employing KOH can be employed to remove the sacrificial cover material layer 601L selective to the tunneling dielectric layer (616L, 626L, 636L).

Referring to FIG. 2I, an amorphous semiconductor material layer 602L is deposited in the memory openings 49. The amorphous semiconductor material layer 602L can be deposited directly on the semiconductor surface of the substrate semiconductor layer 10 in the substrate, directly on the epitaxial channel portion 11 (if present), and directly on the tunneling dielectric layer (616L, 626L, 636L). The amorphous semiconductor material layer 602L includes an amorphous semiconductor material such as at least one amorphous elemental semiconductor material, at least one amorphous III-V compound semiconductor material, at least one amorphous II-VI compound semiconductor material, at least one amorphous organic semiconductor material, or other amorphous semiconductor materials known in the art. In one embodiment, the amorphous semiconductor material layer 602L includes amorphous silicon, i.e., an amorphous silicon layer. The amorphous semiconductor material layer 602L can be formed by a conformal deposition method such as low pressure chemical vapor deposition (LPCVD). The thickness of the amorphous semiconductor material layer 602L can be in a range from 2 nm to 10 nm (such as from 2 nm to 5 nm or from 4 nm to 10 nm), although lesser and greater thicknesses can also be employed.

Generally, any semiconductor precursor material can be employed to deposit the amorphous semiconductor material layer 602L. For example, precursors such as $SiH_4$, $SiH_2Cl_2$, $SiHCl_3$, $SiCl_4$, $SiH_2Cl_2$, $GeH_4$, $GeH_2Cl_2$, or precursors for III-V compound semiconductor materials or II-VI compound semiconductor materials can be employed. In one embodiment, the amorphous semiconductor material layer 602L can include amorphous silicon, and can be formed by a chemical vapor deposition (CVD) process that employs disilane ($Si_2H_6$) as a precursor gas. Under optimized deposition conditions, use of disilane can practically eliminate the pinhole density in the deposited amorphous semiconductor material layer 602L if the thickness of the amorphous semiconductor material layer is about 4 nm or greater. The advantageous effect of disilane in reducing the pinhole density in a deposited silicon film is described in A. Khandekar et al., Low Pressure Chemical Vapor Deposition of Ultra-Thin, Pinhole-Free Amorphous Silicon Films, Workshop on Microelectronics and Electron Devices, 2009. WMED 2009. IEEE, Apr. 3, 2009, pp. 1-4.

Referring to FIG. 2J, a surface portion of the amorphous semiconductor material layer 602L is converted into a semiconductor oxide layer 621L. The surface roughness of the interface between the remaining portion of the amorphous semiconductor material layer 602L and the semiconductor oxide layer 621L is less than the surface roughness of the physically exposed surface of the amorphous semiconductor material layer 602L prior to formation of the semiconductor oxide layer. The improvement in the surface roughness of the inner surface (i.e., the surface that is more proximal to the axis of each memory opening 49) of the amorphous semiconductor material layer 602L is the mechanism of the oxidation process that provides a greater oxidation rate to protruding portions of the inner surface of the amorphous semiconductor material layer 602L.

In one embodiment, the surface portion of the amorphous semiconductor material layer 602L can be converted into the semiconductor oxide layer 621L employing an in-situ steam generation oxidation process in which hydrogen gas and oxygen gas are provided into a process chamber to form water vapor in-situ. In one embodiment, the process temperature and the duration of the in-situ steam generation oxidation process can be selected such that the remaining portion of the amorphous semiconductor material layer 602L remains an amorphous material. In one embodiment, the temperature of the in-situ steam generation oxidation process can be less than 600 degrees Celsius, and/or can be less than 575 degrees Celsius, and/or can be less than 550 degrees Celsius, and/or can be less than 525 degrees Celsius (such as from 450 degrees Celsius to 575 degrees Celsius). In one embodiment, the remaining portion of the amorphous semiconductor material layer 602L has a thickness not greater than 5.0 nm (such as from 2 nm to 5 nm). In one embodiment, the semiconductor oxide layer 621L can be a silicon oxide layer. In one embodiment, the thickness of the semiconductor oxide layer 621L can be in a range from 0.5 nm to 5 nm (such as from 0.6 nm to 3 nm), although lesser and greater thicknesses can also be employed. In one embodiment, the surface roughness of the interface between the remaining portion of the amorphous semiconductor material layer 602L and the semiconductor oxide layer 621L can be not greater than 10% (such as from 0.1% to 10%) of the thickness of the remaining portion of the amorphous semiconductor material layer 602L. For example, the surface roughness may be less than 0.5 nm in root mean square thickness (such as from 0.05 nm to 0.5 nm root mean square thickness) for a 5 nm thick channel. In another embodiment, the surface roughness may be less than 0.5 nm in root mean square thickness for any thickness of the channel (i.e., where the channel is not limited to 5 nm thickness). In one embodiment, the remaining portion of the amorphous semiconductor material layer 602L can be a predominant portion of the amorphous semiconductor material layer 602L as originally deposited. In other words, the volume of the remaining portion of the amorphous semiconductor material layer 602L can be greater than 50% (such as from 60% to 90%) of the volume of the amorphous semiconductor material layer 602L as originally deposited.

Referring to FIG. 2K, the remaining portions of the amorphous semiconductor material layer 602L (which is a predominant portion of the amorphous semiconductor material layer 602L as deposited) are converted into a polycrystalline semiconductor material layer 60L employing an anneal process. The temperature of the anneal process is selected such that the amorphous material of the amorphous semiconductor material layer 602L is transformed into a polycrystalline semiconductor material.

In one embodiment, the semiconductor channel (as embodied by each portion of the polycrystalline semiconductor material layer 60L in a memory opening) may be doped with neutral atoms such as argon or other noble gas atoms. As used herein, a "neutral atom" refers to an atom that does not introduce p-type doping or n-type doping into a semiconductor material. The target atomic concentration of argon atoms can be in a range from $1.0 \times 10^{17}/cm^3$ to $5.0 \times 10^{20}/cm^3$, although lesser and greater atomic concentrations may also be employed to the degree that affects the electronic transport properties of the semiconductor channel. An exemplary process that can be employed to introduce argon doping is an anneal process at an elevated temperature in an ambient that contains argon at an atomic concentration of at least 10%. The total pressure of the anneal process can be in a range from 1 atm (atmospheric pressure) to 25 atm (such as from 2 atm to 20 atm). In case the pressure of the anneal process is greater than 1 atm, the anneal process can be performed in a high pressure processing chamber configured to contain a pressurized ambient. In one embodiment, the partial pressure of argon in the argon-containing ambient of the anneal process can be in a range from 0.1 atm to 25 atm. In one embodiment, the partial pressure of argon in the argon-containing ambient of the anneal process can be in a range from 1 atm to 25 atm. In one embodiment, the argon-containing ambient of the anneal process can include argon atoms at an atomic concentration of 100%, i.e., can consist of argon gas.

The anneal process can be a crystallization process in which an amorphous silicon material is crystallized into a polycrystalline semiconductor channel. In an illustrative example, the elevated temperature can be in a range from 700 degrees Celsius to 1,100 degrees Celsius. The duration of the anneal at the elevated temperature can be in a range from a fraction of a second (e.g., 0.1 seconds) to 4 hours. Generally, a shorter anneal duration is selected for a high anneal temperature, and vice versa. In one illustrative example, at a higher end of temperature range, the anneal duration can be from less than one minute to 15 minutes. In another illustrative example, at even higher temperature (e.g. 1000 to 1100 degrees Celsius), the anneal duration can be in the range of a fraction of a second (e.g., 0.1 to 0.5 seconds) to one second using a method such as rapid thermal annealing (RTA), spike anneal, flash anneal, etc.

According to an embodiment of the present disclosure, the anneal process is performed in an ambient gas composition that includes argon at an atomic concentration greater than 10%. In this case, the polycrystalline semiconductor material layer can be an argon-doped semiconductor material layer 60L, i.e., a semiconductor material layer that includes argon at a concentration above a trace level. In one embodiment, the argon-doped semiconductor material layer 60L can comprise argon-doped polycrystalline silicon. The argon-doped semiconductor material layer 60L can include argon at an atomic concentration in a range from $1.0 \times 10^{17}/cm^3$ to $5.0 \times 10^{20}/cm^3$. In one embodiment, the atomic concentration of argon can be greater than $2.0 \times 10^{17}/cm^3$, and/or can be greater than $5.0 \times 10^{17}/cm^3$, and/or can be greater than $1.0 \times 10^{18}/cm^3$, and/or can be greater than $2.0 \times 10^{18}/cm^3$, and/or can be greater than $5.0 \times 10^{18}/cm^3$, and/or can be greater than $1.0 \times 10^{19}/cm^3$, and/or can be greater than $2.0 \times 10^{19}/cm^3$, and/or can be greater than $5.0 \times 10^{19}/cm^3$, and/or can be greater than $1.0 \times 10^{20}/cm^3$, and/or can be greater than $2.0 \times 10^{20}/cm^3$, and/or can be greater than $5.0 \times 10^{20}/cm^3$. In one embodiment, the atomic concentration of argon can be less than $2.0 \times 10^{20}/cm^3$, or can be less than $1.0 \times 10^{20}/cm^3$, and/or can be less than $5.0 \times 10^{19}/cm^3$, and/or can be less than $2.0 \times 10^{19}/cm^3$, and/or can be less than $1.0 \times 10^{19}/cm^3$, and/or can be less than $5.0 \times 10^{18}/cm^3$, and/or can be less than $2.0 \times 10^{18}/cm^3$, and/or can be less than $1.0 \times 10^{18}/cm^3$, and/or can be less than $5.0 \times 10^{17}/cm^3$, and/or can be less than $2.0 \times 10^{17}/cm^3$.

The ambient gas composition can optionally comprise deuterium gas at an atomic concentration greater than 10%. In this case, the argon-doped semiconductor material layer 60L can include deuterium at a concentration above a trace level. In one embodiment, the atomic concentration of deuterium in the ambient gas composition can be greater than 20%, and may be greater than 30%, and may be greater than 40%. In one embodiment, the argon-doped semiconductor material layer 60L can comprise argon-doped and deuterium-doped polycrystalline silicon. The argon-doped semiconductor material layer 60L can include deuterium at an atomic concentration in a range from $1.0 \times 10^{17}/cm^3$ to $5.0 \times 10^{20}/cm^3$. Deuterium passivates dangling bonds in silicon, and has less tendency to diffuse out of silicon than hydrogen. In one embodiment, the atomic concentration of deuterium can be greater than $2.0 \times 10^{17}/cm^3$, and/or can be greater than $5.0 \times 10^{17}/cm^3$, and/or can be greater than $1.0 \times 10^{18}/cm^3$, and/or can be greater than $2.0 \times 10^{18}/cm^3$, and/or can be greater than $5.0 \times 10^{18}/cm^3$, and/or can be greater than $1.0 \times 10^{19}/cm^3$, and/or can be greater than $2.0 \times 10^{19}/cm^3$, and/or can be greater than $5.0 \times 10^{19}/cm^3$, and/or can be greater than $1.0 \times 10^{20}/cm^3$, and/or can be greater than $2.0 \times 10^{20}/cm^3$. In one embodiment, the atomic concentration of deuterium can be less than $2.0 \times 10^{20}/cm^3$, and/or can be less than $1.0 \times 10^{20}/cm^3$, and/or can be less than $5.0 \times 10^{19}/cm^3$, and/or can be less than $2.0 \times 10^{19}/cm^3$, and/or can be less than $1.0 \times 10^{19}/cm^3$, and/or can be less than $5.0 \times 10^{18}/cm^3$, and/or can be less than $2.0 \times 10^{18}/cm^3$, and/or can be less than $1.0 \times 10^{18}/cm^3$, and/or can be less than $5.0 \times 10^{17}/cm^3$, and/or can be less than $2.0 \times 10^{17}/cm^3$.

The argon-doped semiconductor material layer 60L can have an interface trap density that is not greater than $1.0 \times 10^{12}/cm^2$ (such from $5.0 \times 10^{10}/cm^2$ to $1.0 \times 10^{12}/cm^3$). The interface trap density refers to a total number of interface trap states per unit area of an interface. Each vertical portion of the argon-doped semiconductor material layer 60L has an outer sidewall (which is an outer interface) that contacts a sidewall of the thermal silicon oxide layer 536L, and has an inner sidewall (which is an inner interface) that contacts a sidewall of the semiconductor oxide layer 621L. In one embodiment, the interface trap density of the outer sidewall of each vertical portion of the argon-doped semiconductor material layer 60L can be not greater than $1.0 \times 10^{12}/cm^2$ (such from $5.0 \times 10^{10}/cm^2$ to $1.0 \times 10^{12}/cm^3$), and the interface trap density of the inner sidewall of each vertical portion of the argon-doped semiconductor material layer 60L can be not greater than $1.0 \times 10^{12}/cm^2$ (such from $5.0 \times 10^{10}/cm^2$ to $1.0 \times 10^{12}/cm^3$).

Subsequently, a rapid thermal anneal (RTA) process can be performed to grow the grain size of the semiconductor channel. In an illustrative example, the RTA process can be performed in a nitrogen-containing ambient (such as 100% $N_2$ gas ambient) with a peak temperature of about 1,050 degrees Celsius.

Argon gas can improve the surface roughness of polycrystalline silicon to a level less than 0.5 nm, such as between 0.2 nm and 0.3 nm, as measured by a root-mean-square method. The "surface roughness" in the present disclosure means root-mean-square surface roughness.

Alternatively, phosphine (PH$_3$) or another phosphorus-containing gas may be employed in lieu of, or in addition to, argon within the ambient gas of the anneal process. If a phosphorus-containing gas is employed in the ambient gas of the anneal process, the concentration of the phosphorus-containing gas and the anneal parameters are selected such that the threshold voltage of the vertical field effect transistor is on target after introduction of the phosphorus atoms in the semiconductor channels (i.e., for p-type doped channel, boron concentration should be at least ten times higher than the phosphorus concentration). Gas phase doping may be employed to dope the argon-doped semiconductor material layer 60L with phosphorus. Thus, argon, deuterium and/or phosphorus diffuse into the semiconductor material layer 60L through layer 621L. Layer 621L may remain in the final device in some embodiments and may also be doped with argon, deuterium and/or phosphorus.

Referring to FIG. 2L, a dielectric core layer 62L can be deposited in the cavity 49' to fill any remaining portion of the cavity 49' within each memory opening 49. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 2N:
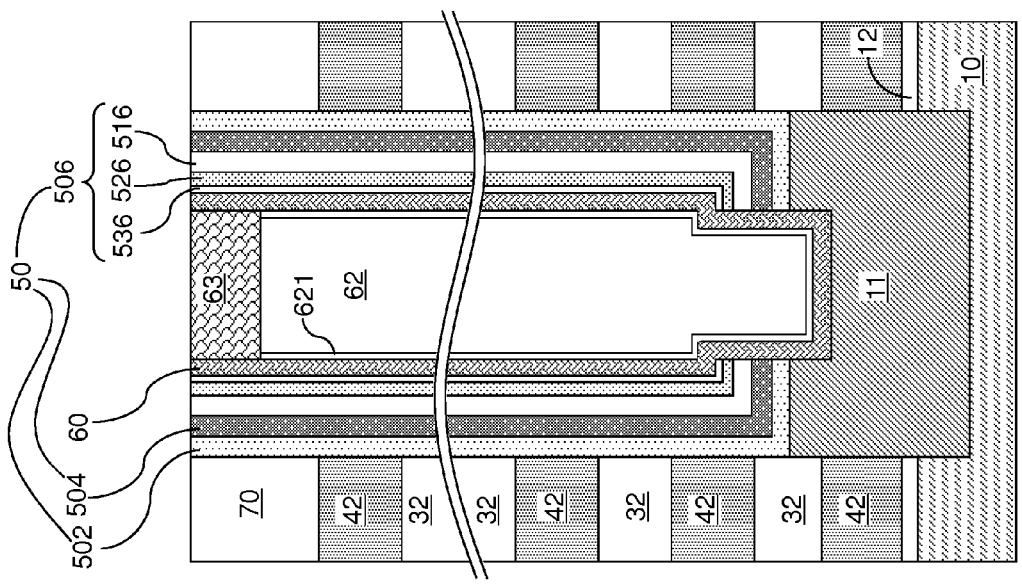
FIGS. 2A-2N are sequential vertical cross-sectional views of a first exemplary memory stack structure during manufacture according to a first embodiment of the present disclosure.
Figure 2M:
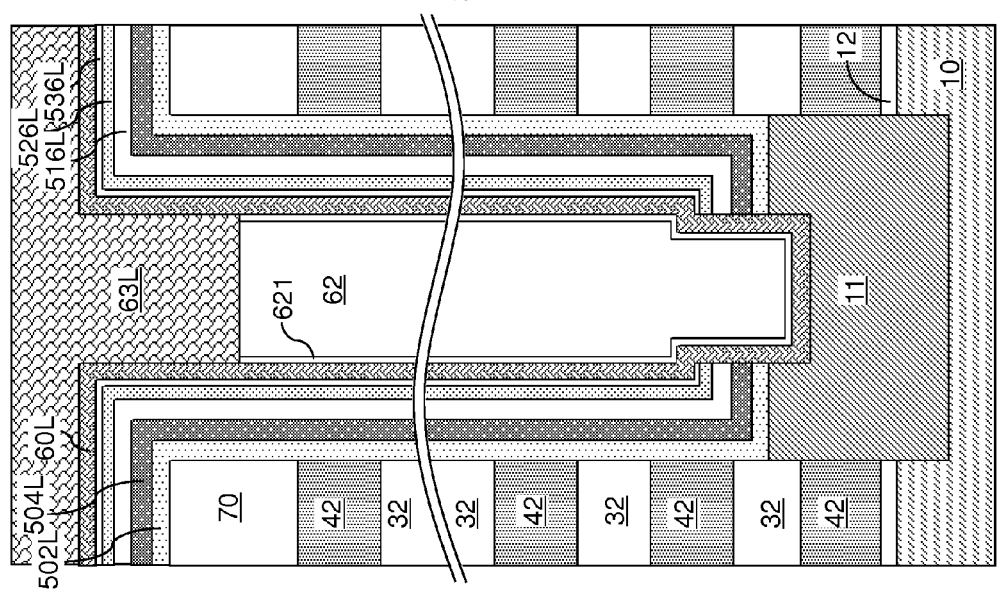

Referring to FIG. 2M, the dielectric materials of the dielectric core layer 62L and the semiconductor oxide layer 621L are removed from above the topmost surface of the argon-doped semiconductor material layer 60L by a recess etch. Further, the dielectric materials of the dielectric core layer 62L and the semiconductor oxide layer 621L are further recessed to form a cavity above each remaining portion of the dielectric core layer 62L. In one embodiment, the top surface of each remaining portion of the dielectric core layer 62L can be between a horizontal plane including the top surface of the insulating cap layer 70 and another horizontal plane including the bottom surface of the insulating cap layer 70. Each remaining portion of the dielectric core layer 62L constitutes a dielectric core 62, and each remaining portion of the semiconductor oxide layer 621L constitutes an inner dielectric interface layer 621, which comprises a semiconductor oxide material.

The recess process can be performed, for example, employing a recess etch, which can be selective, or non-selective, to the materials of the horizontal portions of the argon-doped semiconductor material layer 60L, the tunneling dielectric layer (516L, 526L, 536L), the continuous memory material layer 504L, and the at least one blocking dielectric layer 502L that are located above the horizontal plane including the top surface of the insulating cap layer 70. Thus, the horizontal portions of the argon-doped semiconductor material layer 60L, the tunneling dielectric layer (516L, 526L, 536L), the continuous memory material layer 504L, and the at least one blocking dielectric layer 502L above the insulating cap layer 70 may, or may not, be collaterally removed depending on the chemistry of the recess etch process.

An electrically doped semiconductor material layer 63L can be subsequently deposited in the cavity overlying the dielectric core 62 directly on the physically exposed surfaces of the argon-doped semiconductor material layer 60L. As used herein, an "electrically doped" element refers to a semiconductor element that is p-doped or n-doped. The electrically doped semiconductor material layer 63L includes a semiconductor material having the second conductivity type, which is the opposite type of the first conductivity type. For example, if the substrate semiconductor layer 10 and the epitaxial channel portions 11 have a p-type doping, the electrically doped semiconductor material layer 63L has an n-type doping, and vice versa. In one embodiment, the electrically doped semiconductor material layer 63L can be a doped polysilicon layer.

Referring to FIG. 2N, the portions of the electrically doped semiconductor material layer 63L, the argon-doped semiconductor material layer 60L, the tunneling dielectric layer (516L, 526L, 536L), the continuous memory material layer 504L, and the at least one blocking dielectric layer 502L located above the top surface of the insulating cap layer 70 are removed by a planarization process such as chemical mechanical planarization (CMP). Each remaining portion of the electrically doped semiconductor material layer 63L constitutes a drain region 63. Each remaining portion of the argon-doped semiconductor material layer 60L constitutes a semiconductor channel 60, which comprises a semiconductor material doped with argon and optionally doped with deuterium and/or a combination of boron and phosphorus. Each remaining portion of the thermal silicon oxide layer 536L constitutes a third tunneling dielectric portion 536, each remaining portion of the second tunneling dielectric layer 526L constitutes a second tunneling dielectric portion 526, and each remaining portion of the first tunneling dielectric layer 516L constitutes a first tunneling dielectric portion 516. Each adjoining set of a first tunneling dielectric portion 516, a second tunneling dielectric portion 526, and a third tunneling dielectric portion 536 constitutes a tunneling dielectric 506. Each remaining portion of the continuous memory material layer 504L constitutes a memory material layer 504. Each remaining portion of the at least one blocking dielectric layer 502L constitutes a blocking dielectric 502. Each adjoining set of a blocking dielectric 502, a memory material layer 504, and a tunneling dielectric 506 constitutes a memory film 50. Each remaining portion of the argon-doped semiconductor material layer 60L constitutes a semiconductor channel 60.

In the final device to be constructed, electrical current can flow through each semiconductor channel 60 when a vertical NAND device including the respective semiconductor channel 60 is turned on. A tunneling dielectric 506 is surrounded by a memory material layer 504, and laterally surrounds a portion of the semiconductor channel 60. Each adjoining set of a blocking dielectric 502, a memory material layer 504, and a tunneling dielectric 506 collectively constitute a memory film 50, which can store electrical charges with a macroscopic retention time. In some embodiments, a blocking dielectric 502 may not be employed at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

The memory material layer 504 can comprise a charge trapping material or a floating gate material. In one embodiment, each memory material layer 504 can include a vertical stack of charge storage regions that store electrical charges upon programming. In one embodiment, the memory material layer 504 can be a charge storage layer in which each portion adjacent to the sacrificial material layers 42 constitutes a charge storage region. In one embodiment, each blocking dielectric 502 can include a stack of a remaining portion of the first blocking dielectric layer and a remaining portion of the second blocking dielectric layer. A combination of a memory film 50 and a semiconductor channel 60 constitutes a memory stack structure (50, 60).

The semiconductor channel 60 contacts an outer sidewall of the inner dielectric interface layer 621. The inner sidewall of the inner dielectric interface layer 621 contacts the sidewall of the dielectric core 62. In one embodiment, the inner dielectric interface layer 621 can include thermal silicon oxide. The third tunneling dielectric portion 536 is an outer dielectric interface layer for the semiconductor channel 60. The inner sidewall of the third tunneling dielectric portion 536 (i.e., the outer dielectric interface layer) contacts a sidewall of the semiconductor channel 60. The outer sidewall of the semiconductor channel 60 contacts a sidewall of the outer dielectric interface layer (which is the third tunneling dielectric portion 536), and the inner sidewall of the semiconductor channel 60 contacts a sidewall of the inner dielectric interface layer 621.

Figure 3F:
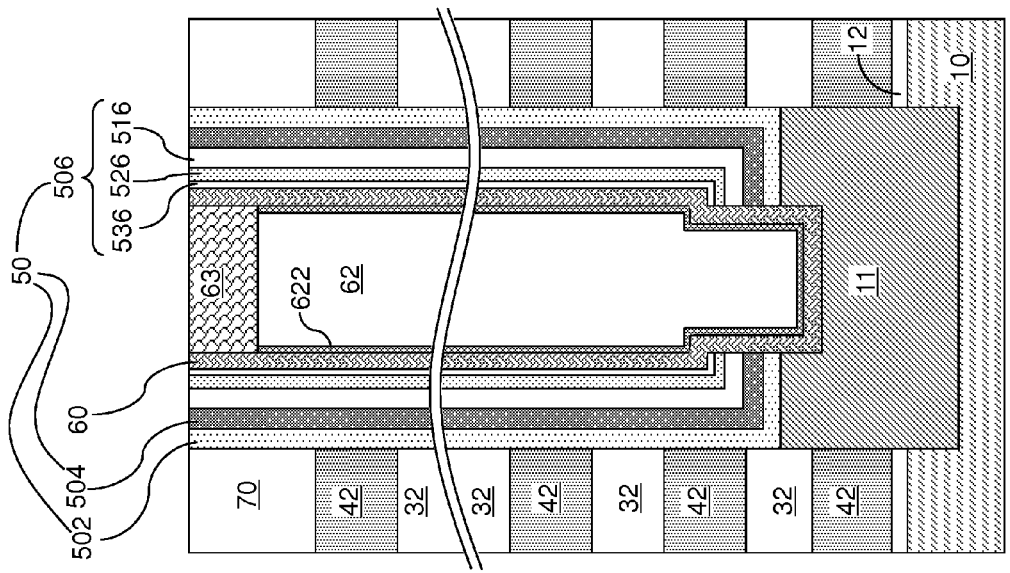

Referring to FIGS. 3A-3F, sequential vertical cross-sectional views of a memory opening are illustrated during formation of a second exemplary memory stack structure. Referring to FIG. 3A, an in-process second exemplary memory stack structure is illustrated, which can be derived from the in-process first exemplary memory stack structure of FIG. 2K by removing the semiconductor oxide layer 621L selective to the amorphous semiconductor material layer 602L. For example, if the semiconductor oxide layer 621L includes silicon oxide and if the amorphous semiconductor material layer 602L includes amorphous silicon, the semiconductor oxide layer 621L can be removed selective to the remaining portions of the amorphous semiconductor material layer 602L by a wet etch employing dilute hydrofluoric acid.

Referring to FIG. 3B, an aluminum oxide layer 622L is formed directly on the inner sidewall of the remaining portion of the amorphous semiconductor material layer 602L. The aluminum oxide layer 622L can be deposited by a conformal deposition method such as atomic layer deposition (ALD). The thickness of the aluminum oxide layer 622L can be in a range from 1 nm to 6 nm, although lesser and greater thicknesses can also be employed.

Referring to FIG. 3C, the remaining portions of the amorphous semiconductor material layer 602L (which is a predominant portion of the amorphous semiconductor material layer 602L as deposited) are converted into a polycrystalline semiconductor material layer employing an anneal process. The temperature of the anneal process is selected such that the amorphous material of the amorphous semiconductor material layer 602L is transformed into a polycrystalline semiconductor material.

The process parameters of the anneal process can be the same as in the anneal process performed at the processing steps of FIG. 2K. The anneal process is performed in an ambient gas composition that includes argon at an atomic concentration greater than 10%. The argon-doped semiconductor material layer 60L can include argon. In one non-limiting embodiment, the argon may be present in the channel at an atomic concentration in a range from $1.0 \times 10^{17}/cm^3$ to $5.0 \times 10^{20}/cm^3$. The atomic concentration of argon in the argon-doped semiconductor material layer 60L can be in any of the ranges for the atomic concentration of argon in the argon-doped semiconductor material layer 60L illustrated in FIG. 2K. However, higher or lower concentrations may also be used. The ambient gas composition can optionally comprise deuterium gas at an atomic concentration greater than 10%. In another embodiment, the argon-doped semiconductor material layer 60L can include deuterium. In one non-limiting embodiment, the deuterium may be present in the channel at an atomic concentration in a range from $1.0 \times 10^{17}/cm^3$ to $5.0 \times 10^{20}/cm^3$. The atomic concentration of deuterium in the argon-doped semiconductor material layer 60L can be in any of the ranges for the atomic concentration of deuterium in the argon-doped semiconductor material layer 60L illustrated in FIG. 2K. However, higher or lower concentrations may also be used.

The argon-doped semiconductor material layer 60L can have an interface trap density that is not greater than $1.0 \times 10^{12}/cm^2$ (such as $5.0 \times 10^{10}/cm^2$ to $1.0 \times 10^{12}/cm^2$). The interface trap density refers to a total number of interface trap states per unit area of an interface. Each vertical portion of the argon-doped semiconductor material layer 60L has an outer sidewall (which is an outer interface) that contacts a sidewall of the thermal silicon oxide layer 536L, and has an inner sidewall (which is an inner interface) that contacts a sidewall of the aluminum oxide layer 622L. In one embodiment, the interface trap density of the outer sidewall of each vertical portion of the argon-doped semiconductor material layer 60L can be not greater than $1.0 \times 10^{12}/cm^2$ (such as $5.0 \times 10^{10}/cm^2$ to $1.0 \times 10^{12}/cm^2$), and the interface trap density of the inner sidewall of each vertical portion of the argon-doped semiconductor material layer 60L can be not greater than $1.0 \times 10^{12}/cm^2$ (such as $5.0 \times 10^{10}/cm^2$ to $1.0 \times 10^{12}/cm^2$).

Referring to FIG. 3D, a dielectric core layer 62L can be deposited in the cavity 49' to fill any remaining portion of the cavity 49' within each memory opening 49. The dielectric core layer 62L can have the same composition as, and can be formed by the same method as, the dielectric core layer 62L illustrated in FIG. 2L.

Figure 3E:
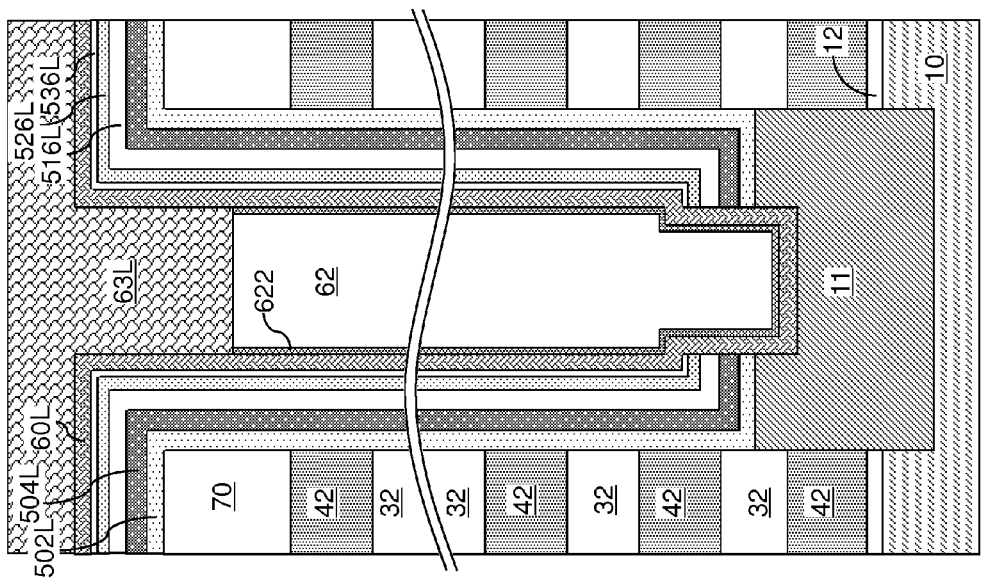

Referring to FIG. 3E, the dielectric materials of the dielectric core layer 62L and the aluminum oxide layer 622L are removed from above the topmost surface of the argon-doped semiconductor material layer 60L by a recess etch. Subsequently, the dielectric materials of the dielectric core layer 62L and the aluminum oxide layer 622L are further recessed to form a cavity above each remaining portion of the dielectric core layer. In one embodiment, the top surface of each remaining portion of the dielectric core layer 62L can be between a horizontal plane including the top surface of the insulating cap layer 70 and another horizontal plane including the bottom surface of the insulating cap layer 70. Each remaining portion of the dielectric core layer constitutes a dielectric core 62, and each remaining portion of the aluminum oxide layer 622L constitutes an inner dielectric interface layer 622, which comprises aluminum oxide. The dielectric core 62 is formed directly on an inner sidewall of an inner dielectric interface layer 622, which is an aluminum oxide layer.

The recess process can be performed, for example, employing a recess etch, which can be selective, or non-selective, to the materials of the horizontal portions of the argon-doped semiconductor material layer 60L, the tunneling dielectric layer (516L, 526L, 536L), the continuous memory material layer 504L, and the at least one blocking dielectric layer 502L that are located above the horizontal plane including the top surface of the insulating cap layer 70. Thus, the horizontal portions of the argon-doped semiconductor material layer 60L, the tunneling dielectric layer (516L, 526L, 536L), the continuous memory material layer 504L, and the at least one blocking dielectric layer 502L above the insulating cap layer 70 may, or may not, be collaterally removed depending on the chemistry of the recess etch process.

An electrically doped semiconductor material layer 63L can be subsequently deposited in the cavity overlying the dielectric core 62 directly on the physically exposed surfaces of the argon-doped semiconductor material layer 60L. The electrically doped semiconductor material layer 63L includes a semiconductor material having the second conductivity type, which is the opposite type of the first conductivity type. For example, if the substrate semiconductor layer 10 and the epitaxial channel portions 11 have a p-type doping, the electrically doped semiconductor material layer 63L has an n-type doping, and vice versa. In one embodiment, the electrically doped semiconductor material layer 63L can be a doped polysilicon layer.

Referring to FIG. 3F, the portions of the electrically doped semiconductor material layer 63L, the argon-doped semiconductor material layer 60L, the tunneling dielectric layer (516L, 526L, 536L), the continuous memory material layer 504L, and the at least one blocking dielectric layer 502L located above the top surface of the insulating cap layer 70 are removed by a planarization process such as chemical mechanical planarization (CMP). Each remaining portion of the electrically doped semiconductor material layer 63L constitutes a drain region 63. Each remaining portion of the argon-doped semiconductor material layer 60L constitutes a semiconductor channel 60, which comprises a semiconductor material doped with argon and optionally doped with deuterium. Each remaining portion of the thermal silicon oxide layer 536L constitutes a third tunneling dielectric portion 536, each remaining portion of the second tunneling dielectric layer 526L constitutes a second tunneling dielectric portion 526, and each remaining portion of the first tunneling dielectric layer 516L constitutes a first tunneling dielectric portion 516. Each adjoining set of a first tunneling dielectric portion 516, a second tunneling dielectric portion 526, and a third tunneling dielectric portion 536 constitutes a tunneling dielectric 506. Each remaining portion of the continuous memory material layer 504L constitutes a memory material layer 504. Each remaining portion of the at least one blocking dielectric layer 502L constitutes a blocking dielectric 502. Each adjoining set of a blocking dielectric 502, a memory material layer 504, and a tunneling dielectric 506 constitutes a memory film 50.

In the final device to be constructed, electrical current can flow through each semiconductor channel 60 when a vertical NAND device including the respective semiconductor channel 60 is turned on. A tunneling dielectric 506 is surrounded by a memory material layer 504, and laterally surrounds a portion of the semiconductor channel 60. Each adjoining set of a blocking dielectric 502, a memory material layer 504, and a tunneling dielectric 506 collectively constitute a memory film 50, which can store electrical charges with a macroscopic retention time. In some embodiments, a blocking dielectric 502 may not be employed at this step, and a backside blocking dielectric layer may be subsequently formed after formation of backside recesses. As used herein, a macroscopic retention time refers to a retention time suitable for operation of a memory device as a permanent memory device, such as a retention time in excess of 24 hours. The minimum retention time requirement is not limiting and may be greater or less than 24 hours.

The memory material layer 504 can comprise a charge trapping material or a floating gate material. In one embodiment, each memory material layer 504 can include a vertical stack of charge storage regions that store electrical charges upon programming. In one embodiment, the memory material layer 504 can be a charge storage layer in which each portion adjacent to the sacrificial material layers 42 constitutes a charge storage region. In one embodiment, each blocking dielectric 502 can include a stack of a remaining portion of the first blocking dielectric layer and a remaining portion of the second blocking dielectric layer. A combination of a memory film 50 and a semiconductor channel 60 constitutes a memory stack structure (50, 60).

The semiconductor channel 60 contacts an outer sidewall of the inner dielectric interface layer 622. The inner sidewall of the inner dielectric interface layer 622 contacts the sidewall of the dielectric core 62. In one embodiment, the inner dielectric interface layer 622 can include aluminum oxide. The third tunneling dielectric portion 536 is an outer dielectric interface layer for the semiconductor channel 60. The inner sidewall of the third tunneling dielectric portion 536 contacts an outer sidewall of the semiconductor channel 60. The third tunneling dielectric portion 536 may be referred to in one embodiment as the "outer dielectric interface layer" which is located on the outside (i.e., further away from the center of the memory opening 49) of the channel. In contrast, the above mentioned inner dielectric interface layer 622 is located on the inside (i.e., closer to the center of the memory opening 49) of the channel. The outer sidewall of the semiconductor channel 60 contacts a sidewall of the outer dielectric interface layer (which is the third tunneling dielectric portion 536), and the inner sidewall of the semiconductor channel 60 contacts a sidewall of the inner dielectric interface layer 622.

Figures 4C, 4D:
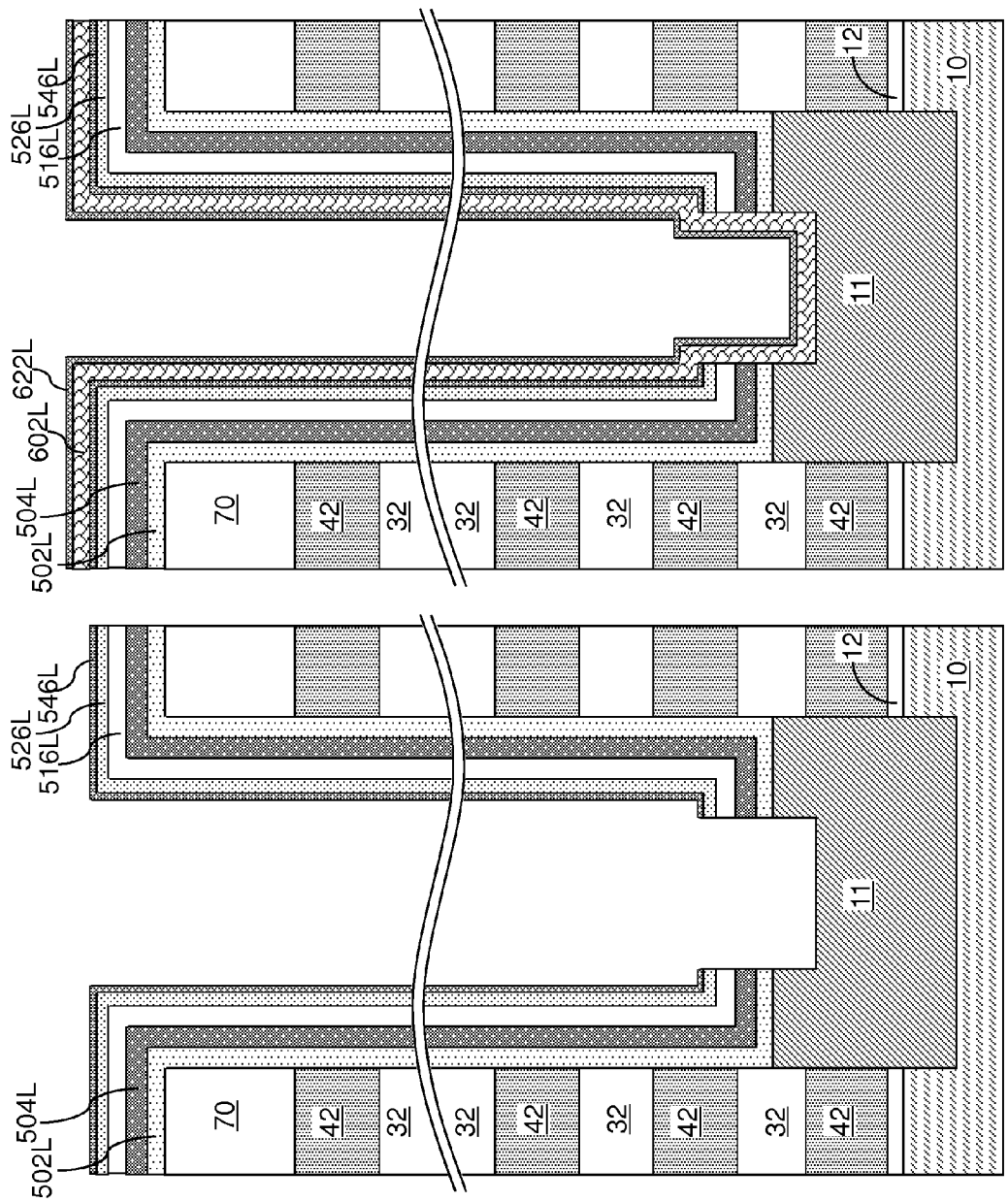

Referring to FIG. 4A-4H, sequential vertical cross-sectional views of a memory opening are illustrated during formation of a third exemplary memory stack structure. Referring to FIG. 4A, an in-process third exemplary memory stack structure is illustrated, which can be derived from the in-process first exemplary memory stack structure of FIG. 2C by depositing a third tunneling dielectric layer 546L including aluminum oxide. The third tunneling dielectric layer 546L including aluminum oxide layer can be formed directly on the second tunneling dielectric layer 526L by a conformal deposition method such as atomic layer deposition (ALD). The thickness of the third tunneling dielectric layer 546L can be in a range from 1 nm to 6 nm, although lesser and greater thicknesses can also be employed. The first tunneling dielectric layer 516L, the second tunneling dielectric layer 526L, and the third tunneling dielectric layer 546L are collectively referred to as a tunneling dielectric layer (516L, 526L, 546L). The tunneling dielectric layer (516L, 526L, 546L) comprises an aluminum oxide layer as the innermost dielectric layer (i.e., the aluminum oxide layer is the closest to the center of the memory opening 49 out of the three tunneling dielectric layers in this embodiment).

Referring to FIG. 4B, the processing steps of FIG. 2E can be performed to form sacrificial cover material layer 601L and an optional non-conformal protective film 603. The sacrificial cover material layer 601L can be deposited on the surfaces of the aluminum oxide layer, which is a portion of the tunneling dielectric layer (516L, 526L, 546L).

Referring to FIG. 4C, the processing steps of FIG. 2F can be performed to etch the physically exposed portions of the optional non-conformal protective film 603, the sacrificial cover material layer 601L, the tunneling dielectric layer (616L, 626L, 646L), the continuous memory material layer 504L, the at least one blocking dielectric layer 502L from the bottom portion of each memory opening 49. If present, the non-conformal protective film 603 can be employed as an etch mask.

Processing steps of FIG. 2G can be performed to remove the non-conformal protective film 603, if present. Sidewalls of the sacrificial cover material layer 601L can be physically exposed after removal of the non-conformal protective film 603.

Optionally, the processing steps of FIG. 2H can be performed to remove the sacrificial cover material layer 601L selective to the tunneling dielectric layer (616L, 626L, 646L). If the sacrificial cover material layer 601L comprises amorphous silicon, a wet etch chemistry employing KOH can be employed to remove the sacrificial cover material layer 601L selective to the tunneling dielectric layer (616L, 626L, 646L).

Referring to FIG. 4D, the processing steps of FIGS. 2I and 2J can be performed to form an amorphous semiconductor material layer 602L and a semiconductor oxide layer 621L. The amorphous semiconductor material layer 602L can be deposited on the surfaces of the aluminum oxide layer within the tunneling dielectric layer (516L, 526L, 546L). Formation of the semiconductor oxide layer 621L reduces the surface roughness of the inner surface of the amorphous semiconductor material layer 602L, i.e., the interface between the remaining portion of the amorphous semiconductor material layer 602L and the semiconductor oxide layer 621L.

Optionally, the processing steps of FIG. 3A can be performed to remove the semiconductor oxide layer 621L selective to the amorphous semiconductor material layer 602L. For example, if the semiconductor oxide layer 621L includes silicon oxide and if the amorphous semiconductor material layer 602L includes amorphous silicon, the semiconductor oxide layer 621L can be removed selective to the remaining portions of the amorphous semiconductor material layer 602L by a wet etch employing dilute hydrofluoric acid.

Optionally, an aluminum oxide layer 622L is formed directly on the inner sidewall of the remaining portion of the amorphous semiconductor material layer 602L. The aluminum oxide layer 622L can be deposited by a conformal deposition method such as atomic layer deposition (ALD). The thickness of the aluminum oxide layer 622 can be in a range from 1 nm to 6 nm, although lesser and greater thicknesses can also be employed. Alternatively, the semiconductor oxide layer 621L may be retained in the final device instead of or in addition to the aluminum oxide layer 622L.

Figure 4F:
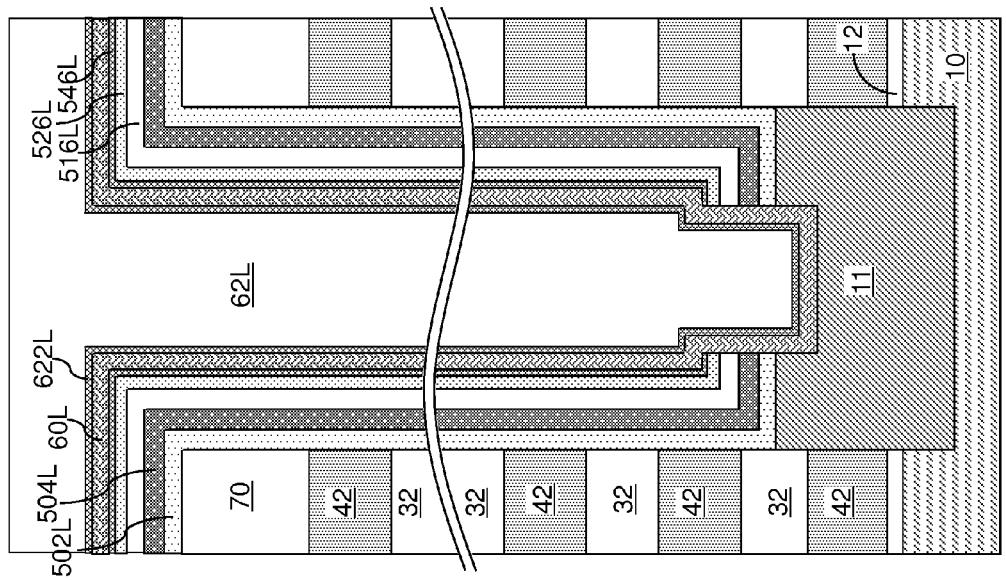
Figure 4E:
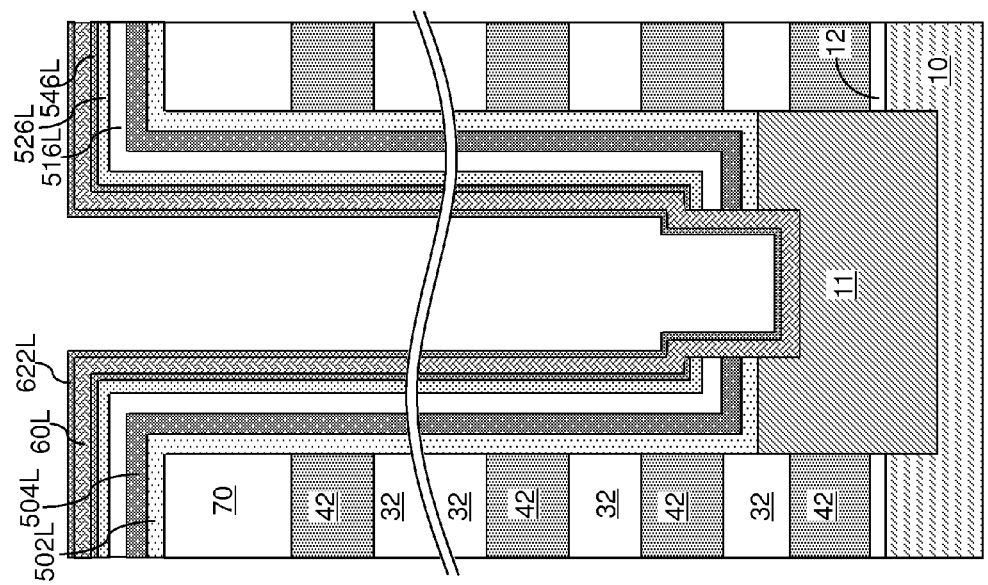

Referring to FIG. 4E, the remaining portions of the amorphous semiconductor material layer 602L (which is a predominant portion of the amorphous semiconductor material layer 602L as deposited) are converted into a polycrystalline semiconductor material layer employing an anneal process. The temperature of the anneal process is selected such that the amorphous material of the amorphous semiconductor material layer 602L is transformed into a polycrystalline semiconductor material.

The process parameters of the anneal process can be the same as in the anneal process performed at the processing steps of FIG. 2K. The anneal process is performed in an ambient gas composition that includes argon at an atomic concentration greater than 10%. The argon-doped semiconductor material layer 60L can include argon at an atomic concentration in a range from $1.0 \times 10^{17}/cm^3$ to $5.0 \times 10^{20}/cm^3$. The atomic concentration of argon in the argon-doped semiconductor material layer 60L can be in any of the ranges for the atomic concentration of argon in the argon-doped semiconductor material layer 60L illustrated in FIG. 2K. The ambient gas composition can optionally comprise deuterium gas at an atomic concentration greater than 10%. The argon-doped semiconductor material layer 60L can include deuterium at an atomic concentration in a range from $1.0 \times 10^{17}/cm^3$ to $5.0 \times 10^{20}/cm^3$. The atomic concentration of deuterium in the argon-doped semiconductor material layer 60L can be in any of the ranges for the atomic concentration of deuterium in the argon-doped semiconductor material layer 60L illustrated in FIG. 2K.

The argon-doped semiconductor material layer 60L can have an interface trap density that is not greater than $1.0 \times 10^{12}/cm^2$ (such as $5.0 \times 10^{10}/cm^2$ to $1.0 \times 10^{12}/cm^2$). The interface trap density refers to a total number of interface trap states per unit area of an interface. Each vertical portion of the argon-doped semiconductor material layer 60L has an outer sidewall (which is an outer interface) that contacts a sidewall of an aluminum oxide layer (i.e., the third tunneling dielectric layer 546L), and has an inner sidewall (which is an inner interface) that contacts a sidewall of the aluminum oxide layer 622L (if layer 622L is present). In one embodiment, the interface trap density of the outer sidewall of each vertical portion of the argon-doped semiconductor material layer 60L can be not greater than $1.0 \times 10^{12}/cm^2$ (such as $5.0 \times 10^{10}/cm^2$ to $1.0 \times 10^{12}/cm^2$), and the interface trap density of the inner sidewall of each vertical portion of the argon-doped semiconductor material layer 60L can be not greater than $1.0 \times 10^{12}/cm^2$ (such as $5.0 \times 10^{10}/cm^2$ to $1.0 \times 10^{12}/cm^2$).

Referring to FIG. 4F, a dielectric core layer 62L can be deposited in the cavity 49' to fill any remaining portion of the cavity 49' within each memory opening 49. The dielectric core layer 62L can have the same composition as, and can be formed by the same method as, the dielectric core layer 62L illustrated in FIG. 2L.

Referring to FIG. 4G, the dielectric materials of the dielectric core layer 62L and the aluminum oxide layer 622L are removed from above the topmost surface of the argon-doped semiconductor material layer 60L by a recess etch. Subsequently, the dielectric materials of the dielectric core layer 62L and the aluminum oxide layer 622L are further recessed to form a cavity above each remaining portion of the dielectric core layer. In one embodiment, the top surface of each remaining portion of the dielectric core layer 62L can be between a horizontal plane including the top surface of the insulating cap layer 70 and another horizontal plane including the bottom surface of the insulating cap layer 70. Each remaining portion of the dielectric core layer constitutes a dielectric core 62, and each remaining portion of the aluminum oxide layer 622L constitutes an inner dielectric interface layer 622, which comprises aluminum oxide. The dielectric core 62 is formed directly on an inner sidewall of an inner dielectric interface layer 622, which is an aluminum oxide layer.

The recess process can be performed, for example, employing a recess etch, which can be selective, or non-selective, to the materials of the horizontal portions of the argon-doped semiconductor material layer 60L, the tunneling dielectric layer (516L, 526L, 546L), the continuous memory material layer 504L, and the at least one blocking dielectric layer 502L that are located above the horizontal plane including the top surface of the insulating cap layer 70. Thus, the horizontal portions of the argon-doped semiconductor material layer 60L, the tunneling dielectric layer (516L, 526L, 546L), the continuous memory material layer 504L, and the at least one blocking dielectric layer 502L above the insulating cap layer 70 may, or may not, be collaterally removed depending on the chemistry of the recess etch process.

An electrically doped semiconductor material layer 63L can be subsequently deposited in the cavity overlying the dielectric core 62 directly on the physically exposed surfaces of the argon-doped semiconductor material layer 60L. The electrically doped semiconductor material layer 63L includes a semiconductor material having the second conductivity type, which is the opposite type of the first conductivity type. For example, if the substrate semiconductor layer 10 and the epitaxial channel portions 11 have a p-type doping, the electrically doped semiconductor material layer 63L has an n-type doping, and vice versa. In one embodiment, the electrically doped semiconductor material layer 63L can be a doped polysilicon layer.

Referring to FIG. 4H, the portions of the electrically doped semiconductor material layer 63L, the argon-doped semiconductor material layer 60L, the tunneling dielectric layer (516L, 526L, 546L), the continuous memory material layer 504L, and the at least one blocking dielectric layer 502L located above the top surface of the insulating cap layer 70 are removed by a planarization process such as chemical mechanical planarization (CMP). Each remaining portion of the electrically doped semiconductor material layer 63L constitutes a drain region 63. Each remaining portion of the argon-doped semiconductor material layer 60L constitutes a semiconductor channel 60, which comprises a semiconductor material doped with argon and optionally doped with deuterium. Each remaining portion of the third tunneling dielectric layer 546L constitutes a third tunneling dielectric portion 546, which is an aluminum oxide layer. Each remaining portion of the second tunneling dielectric layer 526L constitutes a second tunneling dielectric portion 526, and each remaining portion of the first tunneling dielectric layer 516L constitutes a first tunneling dielectric portion 516. Each adjoining set of a first tunneling dielectric portion 516, a second tunneling dielectric portion 526, and a third tunneling dielectric portion 546 constitutes a tunneling dielectric 506. Each remaining portion of the continuous memory material layer 504L constitutes a memory material layer 504. Each remaining portion of the at least one blocking dielectric layer 502L constitutes a blocking dielectric 502. Each adjoining set of a blocking dielectric 502, a memory material layer 504, and a tunneling dielectric 506 constitutes a memory film 50.

In the final device to be constructed, electrical current can flow through each semiconductor channel 60 when a vertical NAND device including the respective semiconductor channel 60 is turned on. A tunneling dielectric 506 is embedded within a memory material layer 504, and laterally surrounds a portion of the semiconductor channel 60. Each adjoining set of a blocking dielectric 502, a memory material layer 504, and a tunneling dielectric 506 collectively constitute a memory film 50, which can store electrical charges with a macroscopic retention time. In some embodiments, a blocking dielectric 502 may not be employed at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours. The minimum retention time requirement is not limiting and may be greater or less than 24 hours.

The memory material layer 504 can comprise a charge trapping material or a floating gate material. In one embodiment, each memory material layer 504 can include a vertical stack of charge storage regions that store electrical charges upon programming. In one embodiment, the memory material layer 504 can be a charge storage layer in which each portion adjacent to the sacrificial material layers 42 constitutes a charge storage region. In one embodiment, each blocking dielectric 502 can include a stack of a remaining portion of the first blocking dielectric layer and a remaining portion of the second blocking dielectric layer. A combination of a memory film 50 and a semiconductor channel 60 constitutes a memory stack structure (50, 60).

The semiconductor channel 60 contacts an outer sidewall of the inner dielectric interface layer 622. The inner sidewall of the inner dielectric interface layer 622 contacts the sidewall of the dielectric core 62. In one embodiment, the inner dielectric interface layer 622 can include aluminum oxide. The third tunneling dielectric portion 546 (which includes aluminum oxide) is an outer dielectric interface layer for the semiconductor channel 60. The outer sidewall of the semiconductor channel 60 contacts a sidewall of the outer dielectric interface layer (which is the third tunneling dielectric portion 546), and the inner sidewall of the semiconductor channel 60 contacts a sidewall of the inner dielectric interface layer 622. In an alternative embodiment, the semiconductor channel of the first, second and/or third memory structures of FIGS. 2N, 3D and/or 4F may exclude argon doping (e.g., may contain no argon or a trace concentration of argon as an unavoidable impurity). In another alternative embodiment, the inner dielectric interface layer 621 may be omitted.

Figure 5:
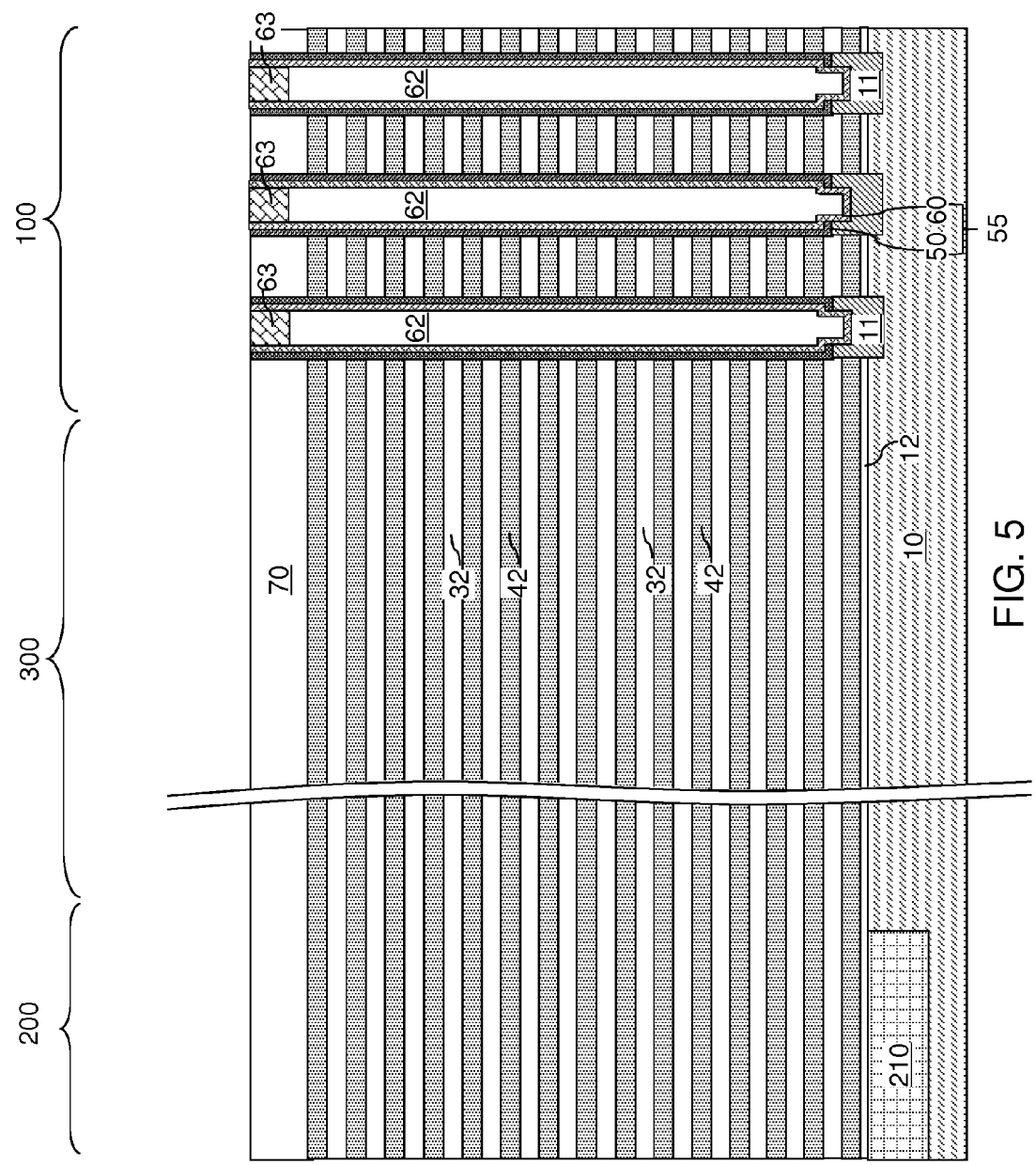
FIG. 5 is a vertical cross-sectional view of the exemplary structure after formation of memory stack structures according to an embodiment of the present disclosure.

FIG. 5 illustrates the exemplary structure that incorporates multiple instances of memory stack structures 55, which can be multiple instances of the first exemplary memory stack structure of FIG. 2N, multiple instances of the second exemplary memory stack structure of FIG. 3F, or multiple instances of the third exemplary memory stack structure of FIG. 4H. Each exemplary memory stack structure 55 includes from inside to outside a semiconductor channel 60; a tunneling dielectric layer 506 laterally surrounding the semiconductor channel 60; and a vertical stack of charge storage regions laterally surrounding the tunneling dielectric layer 506 (as embodied as a memory material layer 504). The exemplary structure includes a semiconductor device, which comprises a stack (32, 42) including an alternating plurality of material layers (e.g., the sacrificial material layers 42) and insulating layers 32 located over a semiconductor substrate that includes the substrate semiconductor layer 10, and a memory opening extending through the stack (32, 42). Each blocking dielectric 502 vertically extends from a bottommost layer (e.g., the bottommost sacrificial material layer 42) of the stack to a topmost layer (e.g., the topmost sacrificial material layer 42) of the stack, and contacts a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 6:
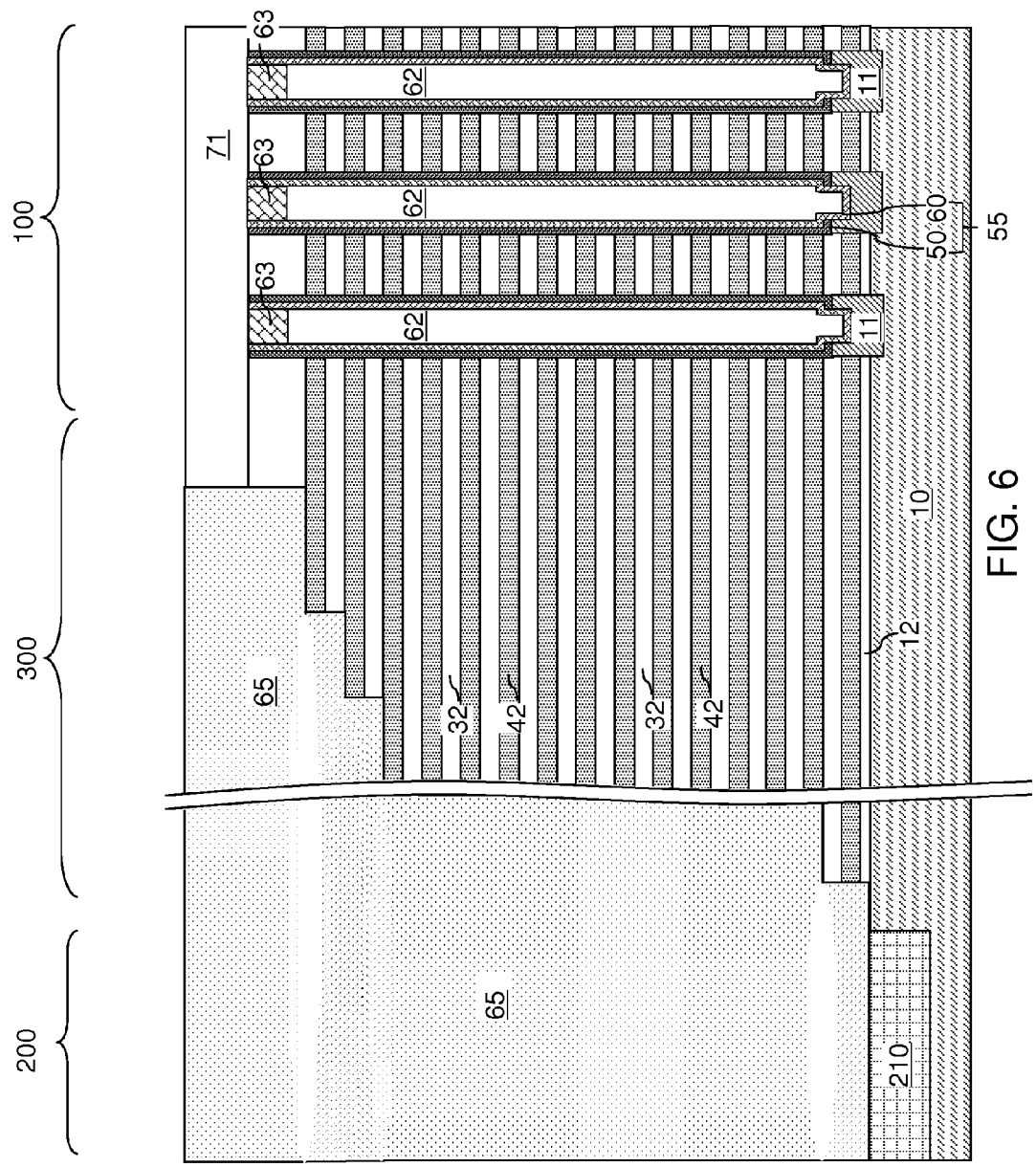
FIG. 6 is a vertical cross-sectional view of the exemplary structure after formation of a set of stepped surfaces and a retro-stepped dielectric material portion according to an embodiment of the present disclosure.

Referring to FIG. 6, an optional first contact level dielectric layer 71 can be formed over the exemplary structure. As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

In one embodiment, the first contact level dielectric layer 71, the insulating cap layer 70, and the alternating stack (32, 42) can be removed from the peripheral device region 200, for example, by a masked etch process. In addition, a stepped cavity can be formed within the contact region 300 by patterning a portion of the alternating stack (32, 42). As used herein, a "stepped cavity" refers to a cavity having stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces.

The stepped cavity can have various stepped surfaces such that the horizontal cross-sectional shape of the stepped cavity changes in steps as a function of the vertical distance from the top surface of the substrate that includes the substrate semiconductor layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating stack is defined as the relative position of a pair of a first material layer and a second material layer within the structure. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide is deposited in the stepped cavity and over the peripheral devices 210 in the peripheral device region 200. Excess portions of the deposited dielectric material can be removed from above the top surface of the first contact level dielectric layer 71, for example, by chemical mechanical planarization (CMP). The remaining portion of the deposited dielectric material filling the stepped cavity in the contact region 300 and overlying the substrate that includes the substrate semiconductor layer 10 in the peripheral device region 200 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the first contact level dielectric layer 71.

The region over the peripheral devices 210 and the region over the stepped cavities can be filled simultaneously with the same dielectric material, or can be filled in different processing steps with the same dielectric material or with different dielectric materials. The cavity over the peripheral devices 210 can be filled with a dielectric material prior to, simultaneously with, or after, filling of the cavity over the stepped surface of the contact region 300 with a dielectric material. While the present disclosure is described employing an embodiment in which the cavity in the peripheral device region 200 and the stepped cavity in the contact region 300 are filled simultaneously, embodiments are expressly contemplated herein in which the cavity in the peripheral device region 200 and the stepped cavity in the contact region 300 are filled in different processing steps.

Figure 7:
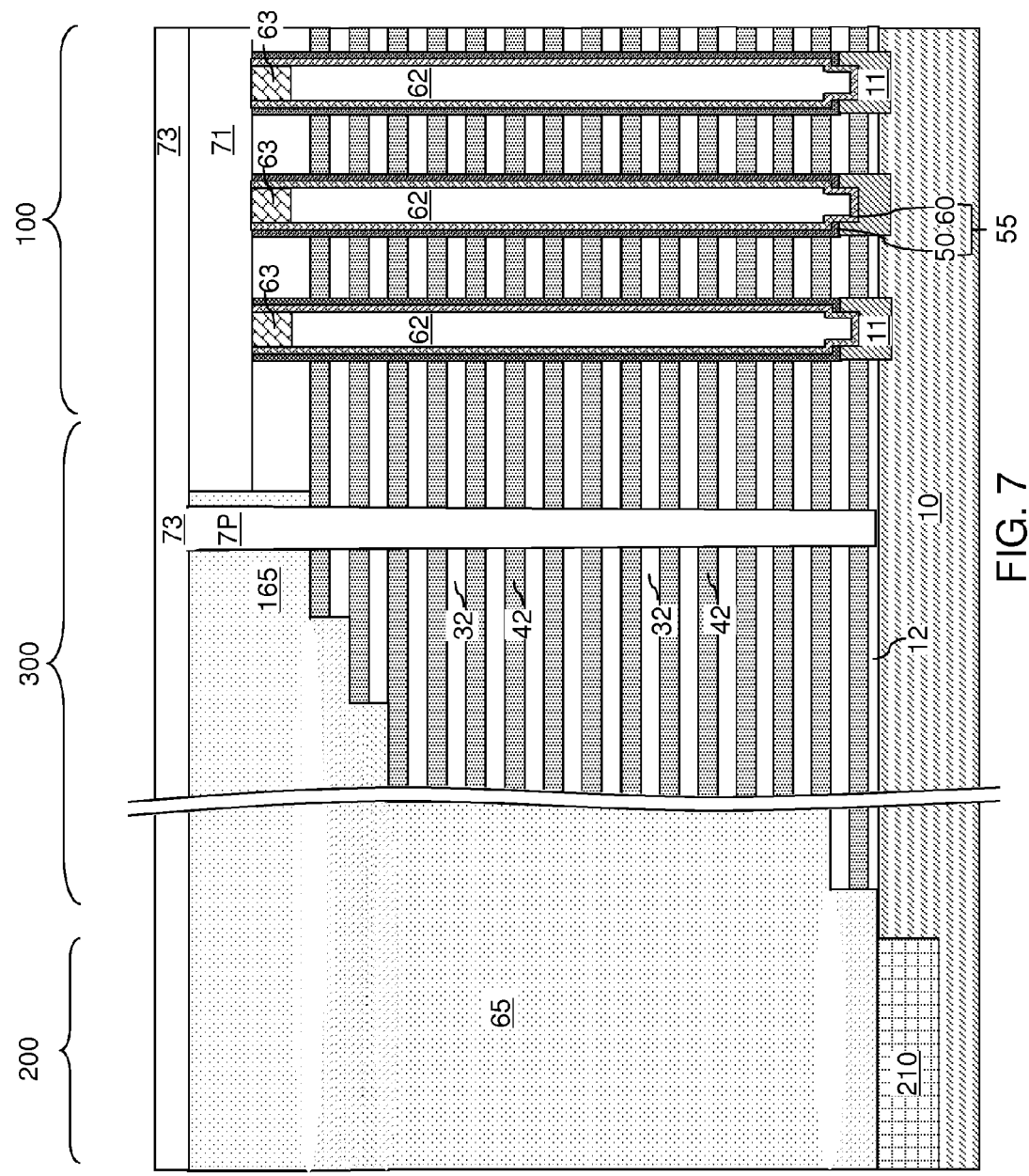
FIG. 7 is a vertical cross-sectional view of the exemplary structure after formation of dielectric pillar structures according to an embodiment of the present disclosure.

Referring to FIG. 7, dielectric support pillars 7P may be optionally formed through the retro-stepped dielectric material portion 65 and/or through the first contact level dielectric layer 71 and/or through the alternating stack (32, 42). In one embodiment, the dielectric support pillars 7P can be formed in the contact region 300, which is located adjacent to the device region 100. The dielectric support pillars 7P can be formed, for example, by forming an opening extending through the retro-stepped dielectric material portion 65 and/or through the alternating stack (32, 42) and at least to the top surface of the substrate (that includes the substrate semiconductor layer 10), and by filling the opening with a dielectric material that is resistant to the etch chemistry to be employed to remove the sacrificial material layers 42.

In one embodiment, the dielectric support pillars 7P can include silicon oxide and/or a dielectric metal oxide such as aluminum oxide. In one embodiment, the portion of the dielectric material that is deposited over the first contact level dielectric layer 71 concurrently with deposition of the dielectric support pillars 7P can be present over the first contact level dielectric layer 71 as a second contact level dielectric layer 73. Each of the dielectric support pillars 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a first source contact via structure.

The second contact level dielectric layer 73 and the dielectric support pillars 7P can be formed as a single continuous structure of integral construction, i.e., without any material interface therebetween. In another embodiment, the portion of the dielectric material that is deposited over the first contact level dielectric layer 71 concurrently with deposition of the dielectric support pillars 7P can be removed, for example, by chemical mechanical planarization or a recess etch. In this case, the second contact level dielectric layer 73 is not present, and the top surface of the first contact level dielectric layer 71 can be physically exposed.

Figure 8A:
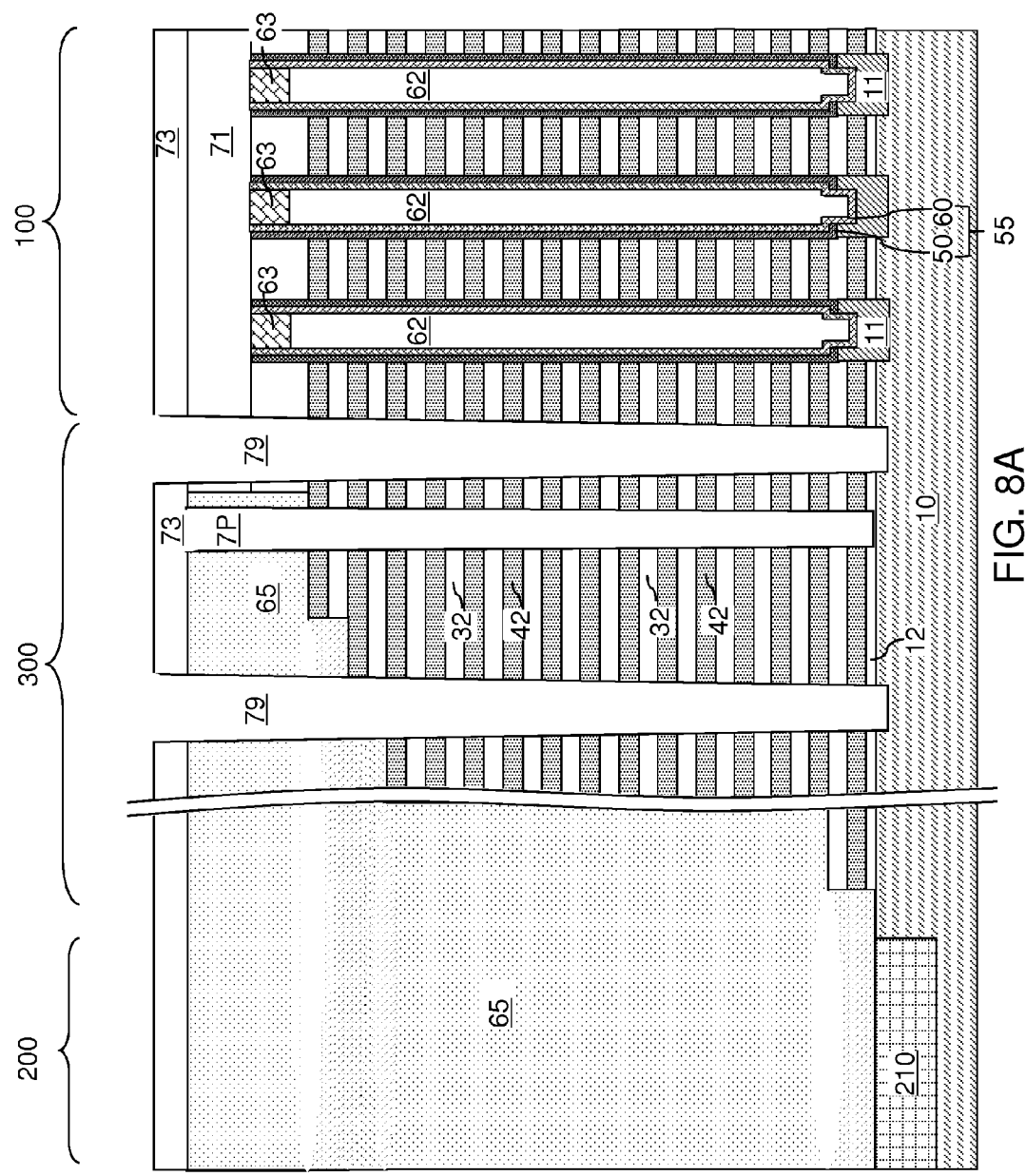
FIG. 8A is a vertical cross-sectional view of the exemplary structure after formation of backside trenches according to an embodiment of the present disclosure.

Referring to FIGS. 8A and 8B, a photoresist layer (not shown) can be applied over the at least one contact level dielectric layer (71, 73), and can be lithographically patterned to form openings within areas between the memory blocks. In one embodiment, the memory blocks can be laterally spaced from one another along a first horizontal direction hd1 (e.g., the bit line direction), and the dimension of each opening in the photoresist layer along the second horizontal direction hd2 (e.g., word line direction) can be less than the spacing between neighboring clusters (i.e., sets) of the memory stack structures 55 along the first horizontal direction hd1. Further, the dimension of each opening in the photoresist layer along a second horizontal direction hd2 (which is parallel to the lengthwise direction of each cluster of memory stack structures 55) can be greater than the extent of each cluster of the memory stack structures 55 along the first horizontal direction hd1.

Backside trenches 79 can be formed between each neighboring pair of clusters of the memory stack structures 55 by transferring the pattern of the openings in the photoresist layer through the at least one contact level dielectric layer (71, 73), the retro-stepped dielectric material portion 65, and the alternating stack (32, 42). A top surface of the substrate semiconductor layer 10 can be physically exposed at the bottom of each backside trench 79. In one embodiment, each backside trench 79 can extend along the second horizontal direction hd2 so that clusters of the memory stack structures 55 are laterally spaced along the first horizontal direction hd1. Each cluster of memory stack structures 55 in conjunction with the portions of the alternating stack (32, 42) that surround the cluster constitutes a memory block. Each memory block is laterally spaced from one another by the backside trenches 79.

In one embodiment, source regions 61 can be formed in, or on, portions of the substrate semiconductor layer 10 (or the epitaxial channel portion 11, if present) underlying the backside trenches 79 by implantation of dopants of a second conductivity type (which is the opposite of the first conductivity type) after formation of the backside trenches 79. For example, if the first conductivity type is p-type, the second conductivity type is n-type, and vice versa.

Figure 9:
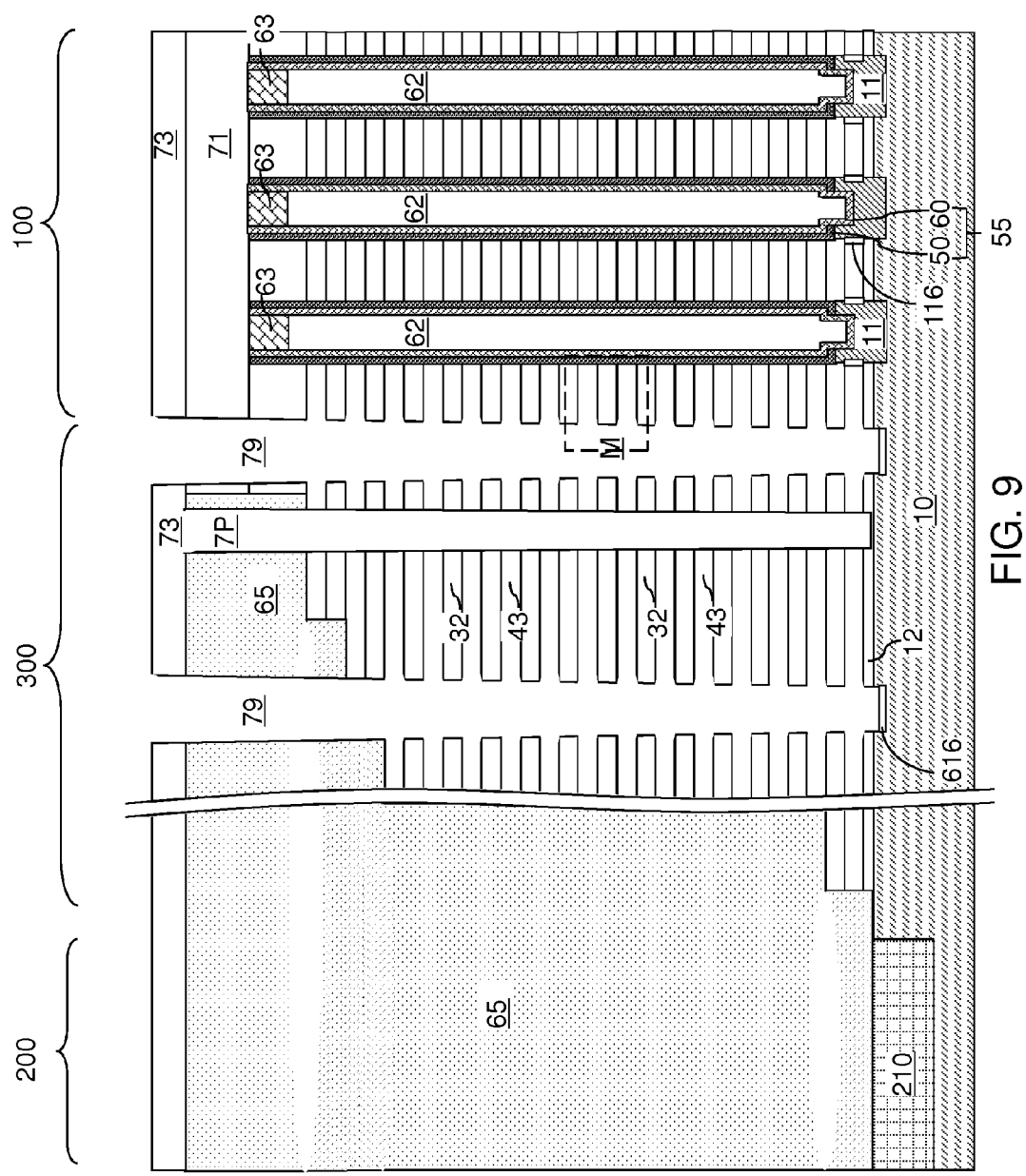
FIG. 9 is a vertical cross-sectional view of the exemplary structure after formation of backside recesses according to an embodiment of the present disclosure.

Referring to FIG. 9, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the dielectric support pillars 7P, the material of the retro-stepped dielectric material portion 65, the semiconductor material of the substrate semiconductor layer 10 (or the epitaxial channel portion 11, if present), and the material of the outermost layer of the first memory films 50. In one embodiment, the sacrificial material layers 42 can include silicon nitride, and the materials of the insulating layers 32, the dielectric support pillars 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the dielectric support pillars 7P, and the retro-stepped dielectric material portion 65 can be selected from silicon oxide, silicon nitride, and dielectric metal oxides. In this case, the depth of the backside trenches 79 can be modified so that the bottommost surface of the backside trenches 79 is located within the gate dielectric layer 12, i.e., to avoid physical exposure of the top surface of the substrate semiconductor layer 10.

The etch process that removes the second material selective to the first material and the outermost layer of the first memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The dielectric support pillars 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The first memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (e.g., above the substrate semiconductor layer 10). In this case, each backside recess 43 can define a space for receiving a respective word line of the array of monolithic three-dimensional NAND strings.

Each of the plurality of backside recesses 43 can extend substantially parallel to the top surface of the substrate semiconductor layer 10. A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Subsequently, physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

A backside blocking dielectric layer (not shown) can be optionally formed. The backside blocking dielectric layer, if present, comprises a dielectric material that functions as a control gate dielectric for the control gates to be subsequently formed in the backside recesses 43. In case at least one blocking dielectric is present within each memory stack structure 55, the backside blocking dielectric layer is optional. In case a blocking dielectric is not present in the memory stack structures 55, the backside blocking dielectric layer is present.

Figure 10:
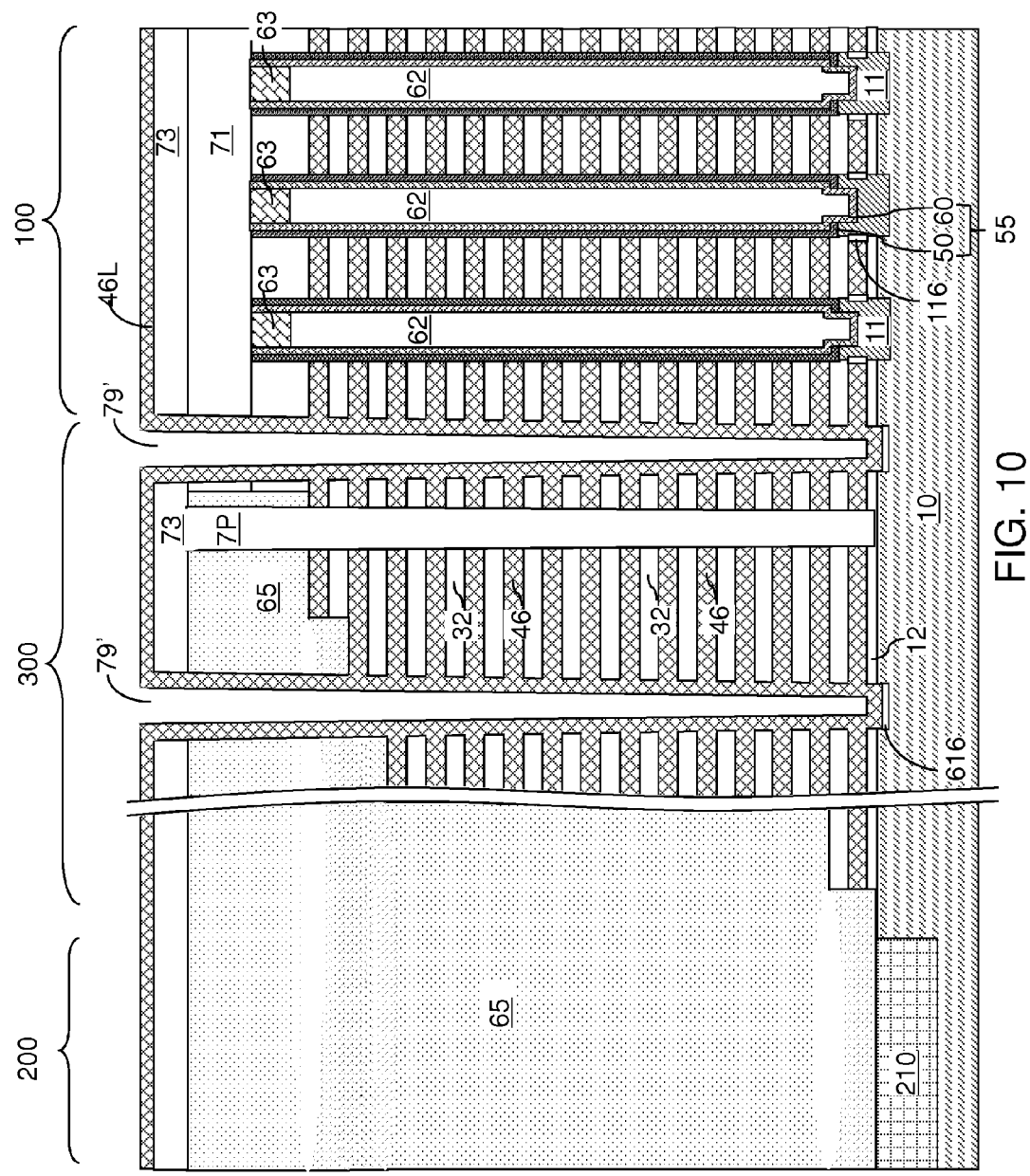
FIG. 10 is a vertical cross-sectional view of the exemplary structure after deposition of a conductive material in the backside recesses and the backside trenches according to an embodiment of the present disclosure.

Referring to FIG. 10, at least one conductive material is deposited in the backside recesses 43 and the backside trenches 79 employing at least one conformal deposition method such as chemical vapor deposition or atomic layer deposition. The portions of the at least one conductive material that are deposited in the backside recesses 43 constitute electrically conductive layers 46. The portions of the at least one conductive material that are deposited in the backside trenches and over the at least one contact level dielectric layer (71, 73) constitute a continuous conductive material layer 46L. The continuous conductive material layer 46L is a continuous layer of the at least one conductive material that overlies sidewalls of the backside trenches 79 and the at least one contact level dielectric layer (71, 73).

The at least one conductive material can include a conductive metallic compound material that functions as a diffusion barrier material and/or an adhesion promoter material. For example, the conductive metallic compound material can comprise a conductive metallic nitride (such as TiN, TaN, or WN) or a conductive metallic carbide (such as TiC, TaC, or WC). The at least one conductive material can further include a conductive metal fill material such as Cu, W, Al, Co, Ni, Ru, Mo, Pt, or a combination thereof. In one embodiment, the at least one conductive material can include a stack of a conductive metallic compound material (such as TiN) and a conductive metal fill material (such as W or Co). The thickness of the deposited at least one conductive material is selected such that the electrically conductive layers 46 fill the entirety of the backside recesses 43, while a backside cavity 79' is present within each backside trench 79 after formation of the continuous conductive material layer 46L.

Figure 11:
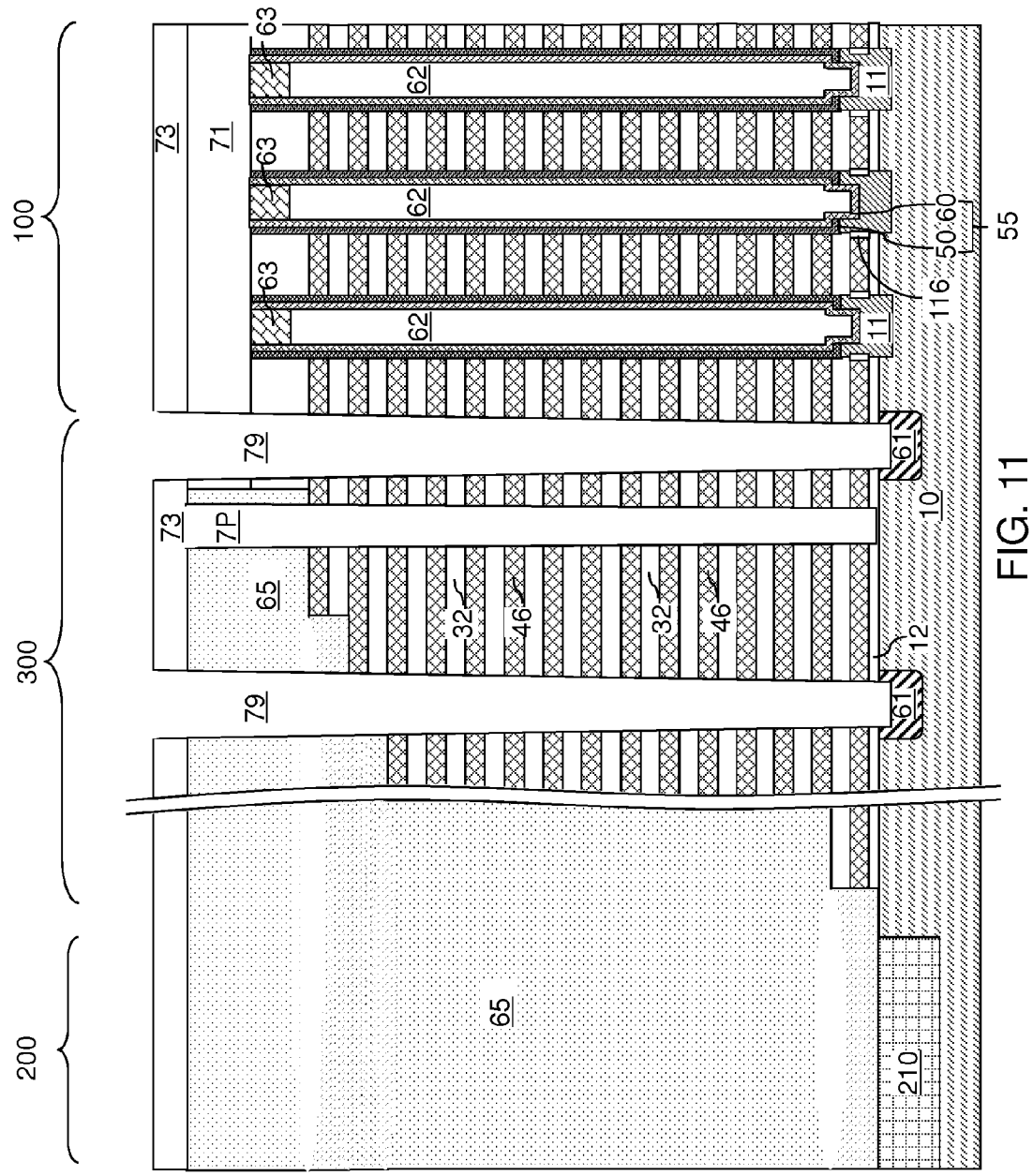
FIG. 11 is a vertical cross-sectional view of the exemplary structure after formation of source regions according to an embodiment of the present disclosure.

Referring to FIG. 11, the continuous conductive material layer 46L can be etched back by an etch process, while a predominant portion of each electrically conductive layers 46 is not etched. In one embodiment, an isotropic etch can be employed to remove the material(s) of the continuous conductive material layer 46L. For example, a wet etch chemistry employing a mixture of hydrofluoric acid and nitric acid, a mixture of nitric acid and hydrogen peroxide, a mixture of hydrochloric acid and hydrogen peroxide, sulfuric acid, or aqua regia may be employed to isotropically etch back the metallic material(s) of the continuous conductive material layer 46L. The continuous conductive material layer 46L is removed from inside the backside trenches 79 and from above the at least one contact level dielectric layer (71, 73) by the etch process. The electrically conductive layers 46 remain in the volumes of the backside recesses 43 after the etch process.

Subsequently, the sacrificial dielectric portions 616 can be removed by an anisotropic etch. A top surface of a single crystalline semiconductor material portion within the substrate semiconductor layer 10 is physically exposed at the bottom of each backside trench 79 after removal of the sacrificial dielectric portions 616.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

Source regions 61 can be formed in, or on, portions of the substrate semiconductor layer 10 underlying the backside trenches 79 by implantation of dopants of a second conductivity type (which is the opposite of the first conductivity type) after formation of the backside trenches 79. For example, if the first conductivity type is p-type, the second conductivity type is n-type, and vice versa.

Figure 12:
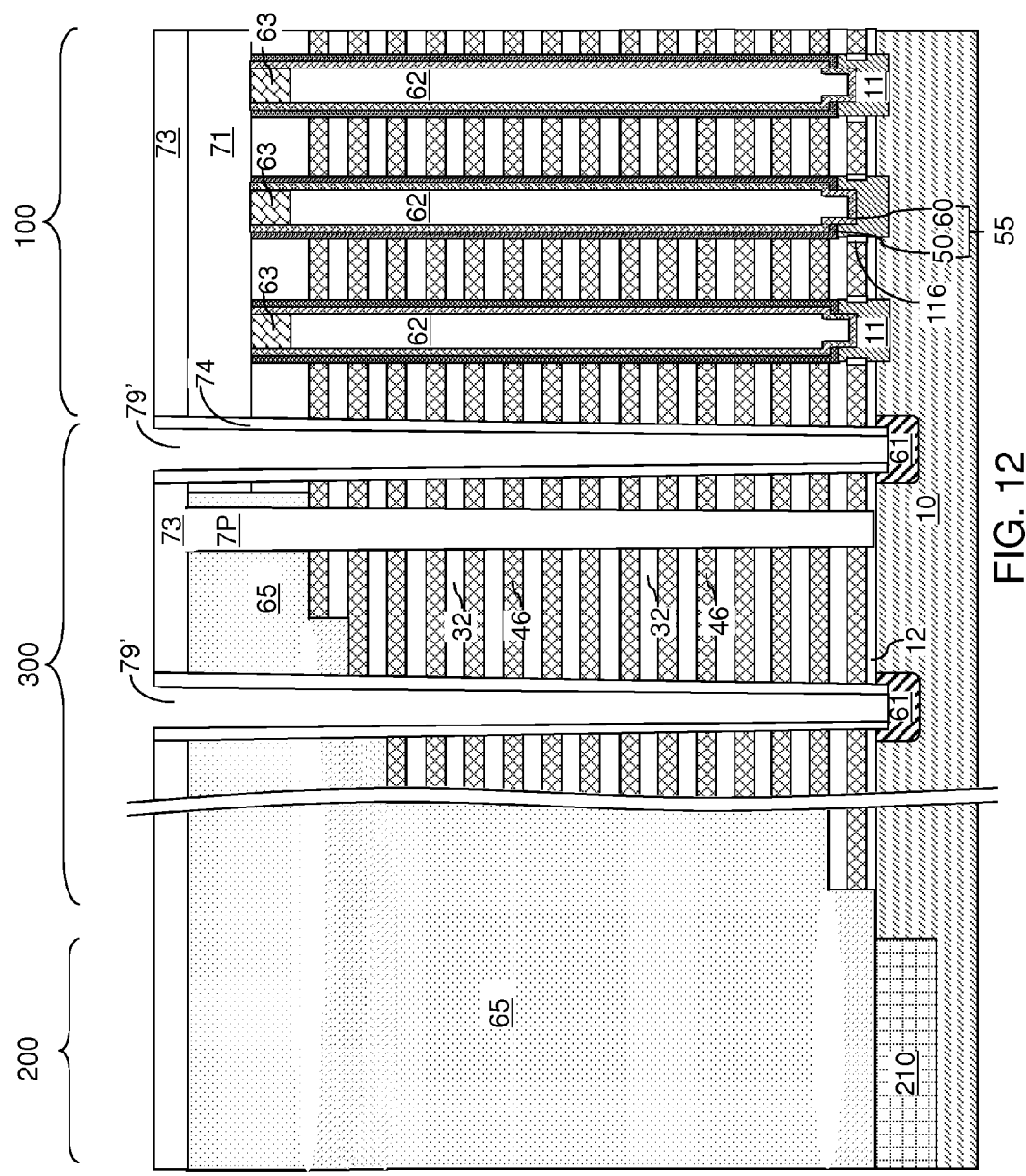
FIG. 12 is a vertical cross-sectional view of the exemplary structure after formation of insulating spacers according to an embodiment of the present disclosure.

Referring to FIG. 12, an insulating material layer is conformally deposited in the backside trenches 79 and over the at least one contact level dielectric layer (71, 73). The insulating material layer includes an insulating material such as silicon oxide, silicon nitride, silicon oxynitride, and/or a dielectric metal oxide. The thickness of the insulating material layer is selected such that a backside cavity 79' is present within each backside trench 79 after deposition of the insulating material layer.

The insulating material layer is anisotropically etched to remove horizontal portions. Each remaining vertical portion of the insulating material layer constitutes an insulating spacer 74 that laterally surrounds a respective backside cavity 79'.

Figure 13:
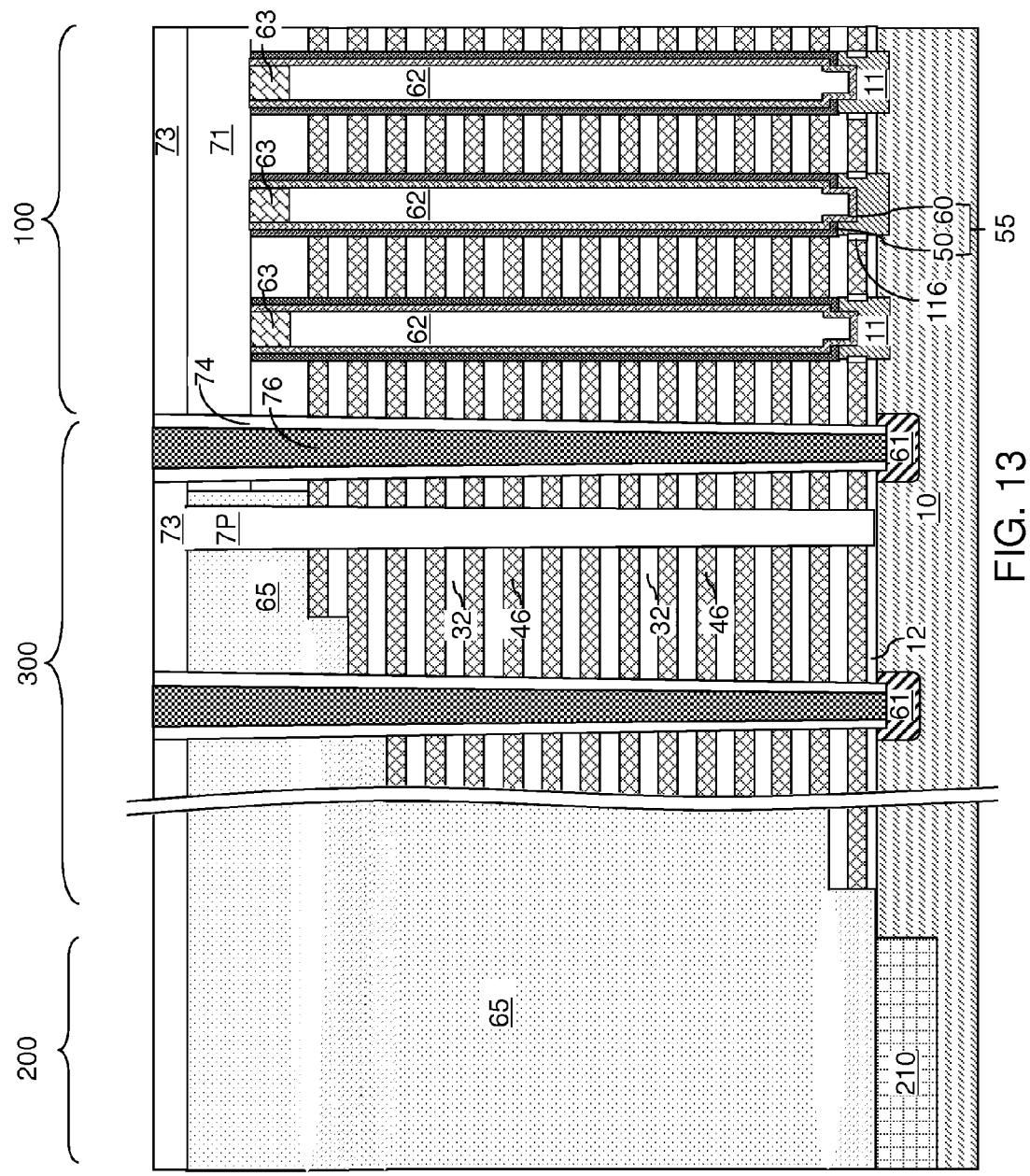
FIG. 13 is a vertical cross-sectional view of the exemplary structure after formation of backside contact via structures according to an embodiment of the present disclosure.

Referring to FIG. 13, at least one conductive material can be subsequently deposited in the cavity surrounded by the insulating spacer to form a contact via structure 76, which can be a source contact via structure that contacts a source region 61. In one embodiment, the at least one conductive material can include a metallic liner material such as a conductive metallic nitride or a conductive metallic carbide, and a metallic fill material such as W, Cu, Al, Co, Ru, and alloys thereof. Excess portion of the at least one conductive material can be removed from above the top surface of the at least one contact level dielectric layer (71, 73), for example, by chemical mechanical planarization. The contact via structure 76 can include a metallic liner portion (which includes a remaining portion of the conductive liner material) and a conductive fill material portion (which includes a remaining portion of the metallic fill material.

Figure 14A:
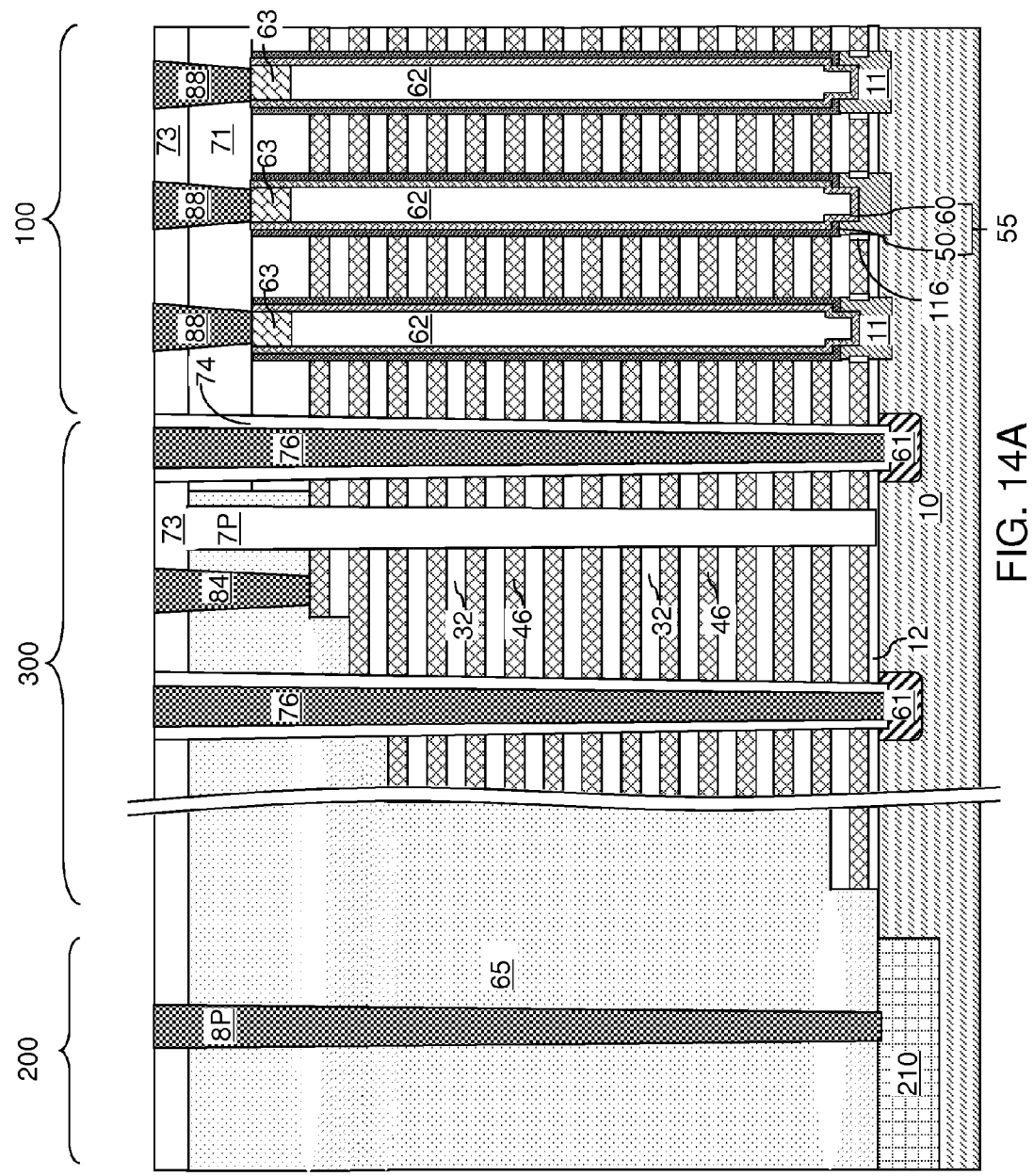
FIG. 14A is a vertical cross-sectional view of the exemplary structure after formation of various additional contact via structures according to an embodiment of the present disclosure.
Figure 14B:
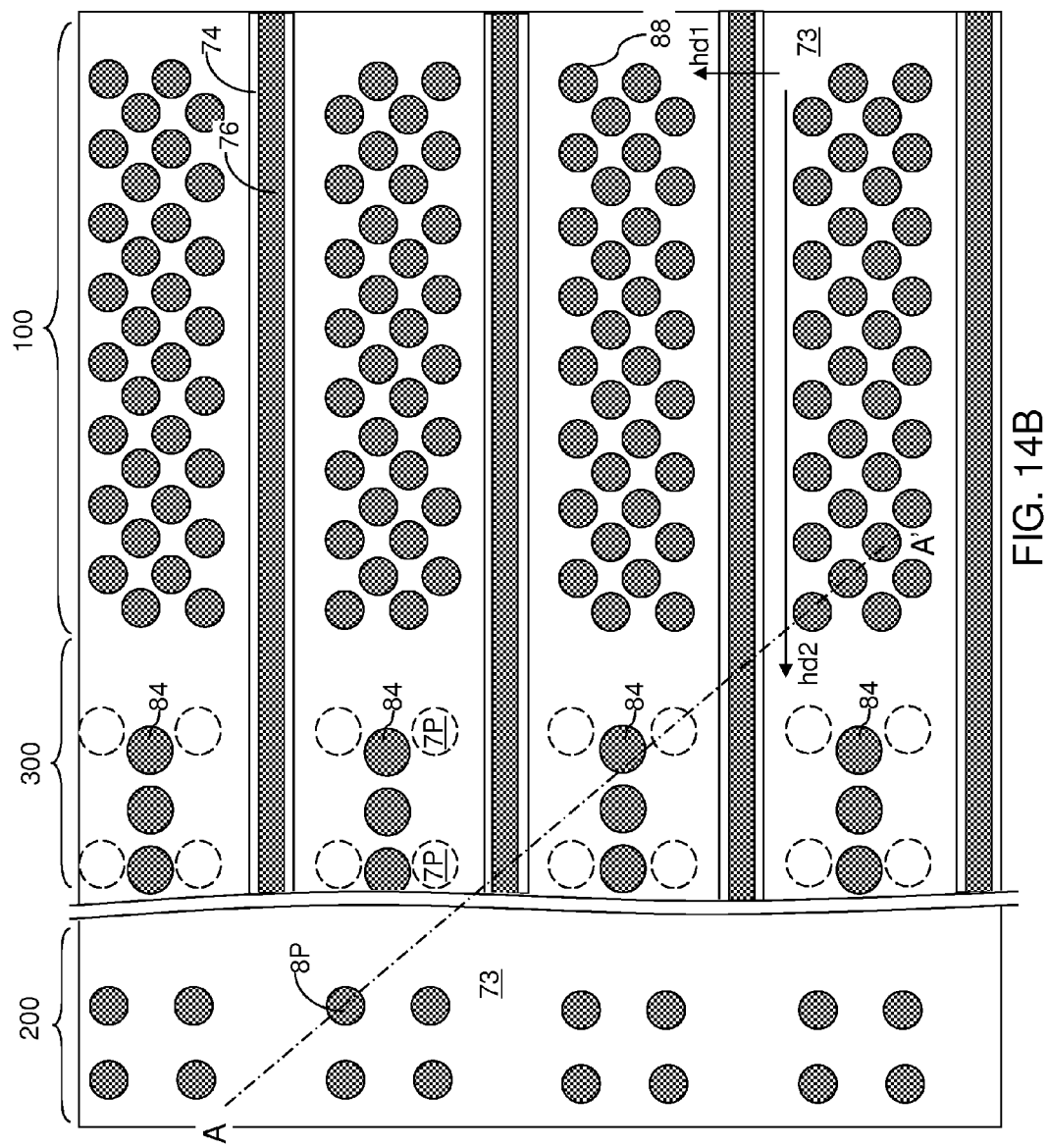
FIG. 14B is a see-through top-down view of the exemplary structure of FIG. 14A. The vertical plane A-A' is the plane of the vertical cross-sectional view of FIG. 14A.

Referring to FIGS. 14A and 14B, a photoresist layer (not shown) can be applied over the topmost layer of the exemplary structure (which can be, for example, the dielectric pillar material layer 73) and in the cavity laterally surrounded by the insulating spacer 74, and is lithographically patterned to form various openings in the device region 100, the peripheral device region 200, and the contact region 300. The locations and the shapes of the various openings are selected to correspond to electrical nodes of the various devices to be electrically contacted by contact via structures. In one embodiment, a single photoresist layer may be employed to pattern all openings that correspond to the contact via cavities to be formed, and all contact via cavities can be simultaneously formed by at least one anisotropic etch process that employs the patterned photoresist layer as an etch mask. In another embodiment, a plurality of photoresist layers may be employed in combination with a plurality of anisotropic etch processes to form different sets of contact via cavities with different patterns of openings in the photoresist layers. The photoresist layer(s) can be removed after a respective anisotropic etch process that transfers the pattern of the openings in the respective photoresist layer through the underlying dielectric material layers and to a top surface of a respective electrically conductive structure.

In an illustrative example, drain contact via cavities can be formed over each memory stack structure 55 in the device region 100 such that a top surface of a drain region 63 is physically exposed at the bottom of each drain contact via cavity. Word line contact via cavities can be formed to the stepped surfaces of the alternating stack (32, 46) such that a top surface of an electrically conductive layer 46 is physically exposed at the bottom of each word line contact via cavity in the contact region 300. A device contact via cavity can be formed to each electrical node of the peripheral devices 210 to be contacted by a contact via structure in the peripheral device region.

The various via cavities can be filled with at least one conductive material, which can be a combination of an electrically conductive metallic liner material (such as TiN, TaN, or WN) and a metallic fill material (such as W, Cu, or Al). Excess portions of the at least one conductive material can be removed from above the at least one contact level dielectric layer (71, 73) by a planarization process, which can include, for example, chemical mechanical planarization (CMP) and/or a recess etch. Drain contact via structures 88 can be formed on the respective drain regions 63. Word line contact via structures 84 can be formed on the respective electrically conductive layers 46. Peripheral device contact via structures 8P can be formed on the respective nodes of the peripheral devices 210. Additional metal interconnect structures (not shown) and interlayer dielectric material layers (not) shown can be formed over the exemplary structure to provide electrical wiring among the various contact via structures.

The exemplary structure can include a three-dimensional memory device. The three-dimensional memory device can include an alternating stack of insulating layers 32 and electrically conductive layers 46 and located over a substrate (that includes the substrate semiconductor layer 10), and memory stack structures 55 extending through the alternating stack (32, 46).

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels 60. At least one end portion of each of the plurality of semiconductor channels 60 extends substantially perpendicular to a top surface of the semiconductor substrate. The device region 100 further includes a plurality of charge storage regions located within each memory film 50. Each charge storage region is located adjacent to a respective one of the plurality of semiconductor channels 60. The device region 100 further includes a plurality of control gate electrodes having a strip shape extending substantially parallel to the top surface of the substrate (that includes the substrate semiconductor layer 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 300 including a plurality of electrically conductive contact via structures.

In case the exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel 60 and at least one charge storage region located adjacent to the semiconductor channel 60. At least one end portion of the semiconductor channel 60 extends substantially perpendicular to the top surface of the semiconductor substrate through the stack (32, 46).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A three-dimensional memory device comprising:
   an alternating stack of insulating layers and electrically conductive layers and located over a substrate; and
   memory stack structures extending through the alternating stack, wherein:
   each memory stack structure comprises a semiconductor channel doped with argon.
2. The three-dimensional memory device of claim 1, wherein an atomic concentration of argon in the semiconductor channel is in a range from $1.0 \times 10^{17}/cm^3$ to $5.0 \times 10^{20}/cm^3$.
3. The three-dimensional memory device of claim 1, wherein the semiconductor channel is further doped with deuterium atoms.

4. The three-dimensional memory device of claim 3, wherein an atomic concentration of deuterium atoms in the semiconductor channel is in a range from $1.0 \times 10^{17}/cm^3$ to $5.0 \times 10^{20}/cm^3$.

5. The three-dimensional memory device of claim 1, wherein the semiconductor channel comprises at least one of:
(a) the semiconductor channel has a thickness not greater than 5.0 nm and a first sidewall having a surface roughness not greater than 10% of the thickness of the semiconductor channel; or
(b) the semiconductor channel has the surface roughness less than 0.5 nm in root mean square thickness.

6. The three-dimensional memory device of claim 5, wherein:
a second sidewall of the semiconductor channel has a surface roughness not greater than 10% of the thickness of the semiconductor channel;
one of the first sidewall and the second sidewall is an inner sidewall; and
another of the first sidewall and the second sidewall is an outer sidewall.

7. The three-dimensional memory device of claim 1, wherein a sidewall of the semiconductor channel is in physical contact with an aluminum oxide layer.

8. The three-dimensional memory device of claim 7, wherein:
the aluminum oxide layer laterally surrounds, and contacts a sidewall of, a dielectric core; and
an outer sidewall of the semiconductor channel is in physical contact with a dielectric interface layer comprising a material selected from silicon oxide and aluminum oxide.

9. The three-dimensional memory device of claim 7, wherein the aluminum oxide layer is an innermost layer of a tunneling dielectric that laterally surrounds the semiconductor channel.

10. The three-dimensional memory device of claim 1, wherein:
each semiconductor channel contacts an outer sidewall of a dielectric interface layer;
an inner sidewall of the dielectric interface layer contacts a sidewall of a dielectric core; and
the dielectric interface layer comprises a material selected from thermal silicon oxide and aluminum oxide.

11. The three-dimensional memory device of claim 1, wherein the semiconductor channel has an interface trap density that is not greater than $1.0 \times 10^{12}/cm^2$.

12. The three-dimensional memory device of claim 1, wherein each of the memory stack structures comprises, from inside to outside:
a respective semiconductor channel;
a tunneling dielectric laterally surrounding the respective semiconductor channel; and
charge storage regions laterally surrounding the tunneling dielectric.

13. The three-dimensional memory device of claim 1, wherein:
the three-dimensional memory device comprises a vertical NAND device formed in a device region;
the electrically conductive layers comprise, or are electrically connected to a respective word line of the NAND device;
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in a first device level and a second control gate electrode located in a second device level;
the electrically conductive layers in the stack are in electrical contact with the plurality of control gate electrodes and extend from the device region to a contact region including the plurality of electrically conductive via connections; and
the substrate comprises a silicon substrate containing a driver circuit for the NAND device.

14. A three-dimensional memory device comprising:
an alternating stack of insulating layers and electrically conductive layers and located over a substrate; and
memory stack structures extending through the alternating stack,
wherein each memory stack structure comprises a semiconductor channel having at least one of:
(a) a thickness not greater than 5.0 nm and a first sidewall having a surface roughness not greater than 10% of the thickness of the semiconductor channel; or
(b) the surface roughness less than 0.5 nm in root mean square thickness and;
wherein each memory stack structure comprises the semiconductor channel doped with argon at an atomic concentration in a range from $1.0 \times 10^{17}/cm^3$ to $5.0 \times 10^{20}/cm^3$.

15. The three-dimensional memory device of claim 14, wherein:
the semiconductor channel has the thickness not greater than 5.0 nm and the first sidewall having the surface roughness not greater than 10% of the thickness of the semiconductor channel;
a second sidewall of the semiconductor channel has a surface roughness not greater than 10% of the thickness of the semiconductor channel;
one of the first sidewall and the second sidewall is an inner sidewall; and
another of the first sidewall and the second sidewall is an outer sidewall.

16. The three-dimensional memory device of claim 14, wherein a sidewall of the semiconductor channel is in physical contact with an aluminum oxide layer and wherein the surface roughness of the semiconductor channel is less than 0.5 nm in root mean square thickness.

17. The three-dimensional memory device of claim 16, wherein:
the aluminum oxide layer laterally surrounds, and contacts a sidewall of, a dielectric core; and
an outer sidewall of the semiconductor channel is in physical contact with a dielectric interface layer comprising a material selected from silicon oxide and aluminum oxide.

18. The three-dimensional memory device of claim 16, wherein the aluminum oxide layer is an innermost layer of a tunneling dielectric that laterally surrounds the semiconductor channel.

19. The three-dimensional memory device of claim 14, wherein the semiconductor channel is further doped with deuterium atoms at an atomic concentration in a range from $1.0 \times 10^{17}/cm^3$ to $5.0 \times 10^{20}/cm^3$.

20. The three-dimensional memory device of claim 14, wherein:
   each semiconductor channel contacts an outer sidewall of a dielectric interface layer; and
   an inner sidewall of the dielectric interface layer contacts a sidewall of a dielectric core; and
   the dielectric interface layer comprises a material selected from thermal silicon oxide and aluminum oxide.

21. The three-dimensional memory device of claim 14, wherein each of the memory stack structures comprises, from inside to outside:
   a respective semiconductor channel;
   a tunneling dielectric laterally surrounding the respective semiconductor channel; and
   charge storage regions laterally surrounding the tunneling dielectric.

22. The three-dimensional memory device of claim 14, wherein:
   the three-dimensional memory device comprises a vertical NAND device formed in a device region;
   the electrically conductive layers comprise, or are electrically connected to a respective word line of the NAND device;
   the device region comprises:
      a plurality of semiconductor channels, wherein at least one end portion of each of the plurality of semiconductor channels extends substantially perpendicular to a top surface of the substrate;
      a plurality of charge storage regions, each charge storage region located adjacent to a respective one of the plurality of semiconductor channels; and
      a plurality of control gate electrodes having a strip shape extending substantially parallel to the top surface of the substrate;
   the plurality of control gate electrodes comprise at least a first control gate electrode located in a first device level and a second control gate electrode located in a second device level;
   the electrically conductive layers in the stack are in electrical contact with the plurality of control gate electrode and extend from the device region to a contact region including the plurality of electrically conductive via connections; and
   the substrate comprises a silicon substrate containing a driver circuit for the NAND device.

23. A three-dimensional memory device comprising:
   an alternating stack of insulating layers and electrically conductive layers and located over a substrate; and
   memory stack structures extending through the alternating stack, wherein:
   each memory stack structure comprises a semiconductor channel including an inner sidewall in physical contact with an outer sidewall of an aluminum oxide layer;
   each memory stack structure comprises the semiconductor channel doped with argon at an atomic concentration in a range from $1.0 \times 10^{17}/cm^3$ to $5.0 \times 10^{20}/cm^3$; and
   the semiconductor channel is further doped with deuterium atoms at an atomic concentration in a range from $1.0 \times 10^{17}/cm^3$ to $5.0 \times 10^{20}/cm^3$.

24. The three-dimensional memory device of claim 23, wherein:
   the aluminum oxide layer laterally surrounds, and contacts a sidewall of, a dielectric core.

25. The three-dimensional memory device of claim 23, wherein an outer sidewall of the semiconductor channel is in physical contact with a dielectric interface layer comprising a material selected from silicon oxide and aluminum oxide.

26. The three-dimensional memory device of claim 23, wherein:
   the semiconductor channel has a thickness not greater than 5.0 nm;
   an inner sidewall of the semiconductor channel has a surface roughness not greater than 10% of the thickness of the semiconductor channel; and
   an outer sidewall of the semiconductor channel has a surface roughness not greater than 10% of the thickness of the semiconductor channel.

27. The three-dimensional memory device of claim 23, wherein:
   each semiconductor channel contacts an outer sidewall of a dielectric interface layer;
   an inner sidewall of the dielectric interface layer contacts a sidewall of a dielectric core; and
   the dielectric interface layer comprises a material selected from thermal silicon oxide and aluminum oxide.

28. The three-dimensional memory device of claim 23, wherein the semiconductor channel has an interface trap density that is not greater than $1.0 \times 10^{12}/cm^2$.

29. The three-dimensional memory device of claim 23, wherein each of the memory stack structures comprises, from inside to outside:
   a respective semiconductor channel;
   a tunneling dielectric laterally surrounding the respective semiconductor channel; and
   charge storage regions laterally surrounding the tunneling dielectric.

30. The three-dimensional memory device of claim 23, wherein:
   the three-dimensional memory device comprises a vertical NAND device formed in a device region;
   the electrically conductive layers comprise, or are electrically connected to a respective word line of the NAND device;
   the device region comprises:
      a plurality of semiconductor channels, wherein at least one end portion of each of the plurality of semiconductor channels extends substantially perpendicular to a top surface of the substrate;
      a plurality of charge storage regions, each charge storage region located adjacent to a respective one of the plurality of semiconductor channels; and
      a plurality of control gate electrodes having a strip shape extending substantially parallel to the top surface of the substrate;
   the plurality of control gate electrodes comprise at least a first control gate electrode located in a first device level and a second control gate electrode located in a second device level;
   the electrically conductive layers in the stack are in electrical contact with the plurality of control gate electrode and extend from the device region to a contact region including the plurality of electrically conductive via connections; and
   the substrate comprises a silicon substrate containing a driver circuit for the NAND device.

31. A three-dimensional memory device comprising:
   an alternating stack of insulating layers and electrically conductive layers and located over a substrate; and
   memory stack structures extending through the alternating stack; wherein:
   each memory stack structure comprises a semiconductor channel;

a sidewall of the semiconductor channel is in physical contact with an aluminum oxide layer; and a surface roughness of the semiconductor channel is less than 0.5 nm in root mean square thickness.

32. The three-dimensional memory device of claim 31, wherein:

the aluminum oxide layer laterally surrounds, and contacts a sidewall of, a dielectric core; and an outer sidewall of the semiconductor channel is in physical contact with a dielectric interface layer comprising a material selected from silicon oxide and aluminum oxide.

33. The three-dimensional memory device of claim 31, wherein the aluminum oxide layer is an innermost layer of a tunneling dielectric that laterally surrounds the semiconductor channel.

* * * * *